US012764213B2

(12) United States Patent
Rieutort-Louis et al.

(10) Patent No.: US 12,764,213 B2
(45) Date of Patent: Oct. 13, 2026

(54) PATTERNING IN DEVICES WITH ORGANIC LIGHT-EMITTING DIODE DISPLAYS AND SENSORS

(71) Applicant: Apple Inc., Cupertino, CA (US)

(72) Inventors: Warren S. Rieutort-Louis, Cupertino, CA (US); Meng-Huan Ho, San Jose, CA (US); Abbas Jamshidi Roudbari, Saratoga, CA (US); Chih Jen Yang, San Jose, CA (US); Chin Wei Hsu, Hsinchu (TW); Jae Won Choi, San Jose, CA (US); Jean-Pierre S. Guillou, La Jolla, CA (US); Ming Xu, Cupertino, CA (US); Rui Liu, San Jose, CA (US); Yi Qiao, San Jose, CA (US); Yu-Wen Liu, Hsinchu (TW); Yuchi Che, Santa Clara, CA (US); Yue Cui, Campbell, CA (US)

(73) Assignee: Apple Inc., Cupertino, CA (US)

( * ) Notice: Subject to any disclaimer, the term of this patent is extended or adjusted under 35 U.S.C. 154(b) by 714 days.

(21) Appl. No.: 17/802,102

(22) PCT Filed: Feb. 2, 2021

(86) PCT No.: PCT/US2021/016222

§ 371 (c)(1),
(2) Date: Aug. 24, 2022

(87) PCT Pub. No.: WO2021/188217

PCT Pub. Date: Sep. 23, 2021

(65) Prior Publication Data

US 2023/0092986 A1 Mar. 23, 2023

Related U.S. Application Data

(60) Provisional application No. 62/991,888, filed on Mar. 19, 2020.

(51) Int. Cl.
*H10K 59/122* (2023.01)
*H04M 1/02* (2006.01)
(Continued)

(52) U.S. Cl.
CPC .......... *H04M 1/0266* (2013.01); *H10K 59/12* (2023.02); *H10K 59/122* (2023.02);
(Continued)

(58) Field of Classification Search
None
See application file for complete search history.

(56) References Cited

U.S. PATENT DOCUMENTS

2012/0106063 A1* 5/2012 Mathew ................ G06F 1/1616 349/110
2013/0119352 A1* 5/2013 Aurongzeb .......... H10K 50/822 438/26

(Continued)

FOREIGN PATENT DOCUMENTS

AU 2013203534 B2 7/2014
CN 109903709 A 6/2019
WO 2018216545 A1 11/2018

*Primary Examiner* — Sue A Purvis
*Assistant Examiner* — Seyon Ali-Simah Punchbeddell
(74) *Attorney, Agent, or Firm* — Treyz Law Group, P.C.; Joseph F. Guihan; Jinie M. Guihan

(57) ABSTRACT

An electronic device may include a display and an optical sensor formed underneath the display. A pixel removal region on the display may at least partially overlap with the sensor. The pixel removal region may include a plurality of non-pixel regions each of which is devoid of thin-film transistors. The plurality of non-pixel regions is configured to increase the transmittance of light through the display to the sensor. In addition to removing thin-film transistors in the pixel removal region, additional layers in the display stack-up may be removed. In particular, a cathode layer, polyimide layer, and/or substrate in the display stack-up may
(Continued)

be patterned to have an opening in the pixel removal region. A polarizer may be bleached in the pixel removal region for additional transmittance gains. The cathode layer may be removed using laser ablation with a spot laser or blanket illumination.

21 Claims, 18 Drawing Sheets

(51) Int. Cl.
*H10K 59/12* (2023.01)
*H10K 59/65* (2023.01)
*H10K 59/80* (2023.01)

(52) U.S. Cl.
CPC ......... *H10K 59/1201* (2023.02); *H10K 59/65* (2023.02); *H10K 59/80521* (2023.02); *H10K 59/8731* (2023.02)

(56) References Cited

U.S. PATENT DOCUMENTS

| | | | | |
|---|---|---|---|---|
| 2018/0151834 | A1* | 5/2018 | Kanaya | H10D 30/6746 |
| 2018/0315357 | A1 | 11/2018 | Nam et al. | |
| 2019/0214601 | A1 | 7/2019 | Park | |
| 2020/0236259 | A1* | 7/2020 | Nakamura | H10K 50/844 |
| 2020/0328375 | A1* | 10/2020 | Won | H10K 50/86 |
| 2020/0403186 | A1* | 12/2020 | Choi | H10K 59/65 |

* cited by examiner

PATTERNING IN DEVICES WITH ORGANIC LIGHT-EMITTING DIODE DISPLAYS AND SENSORS

This application claims priority to U.S. provisional patent application No. 62/991,888, filed Mar. 19, 2020, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack. In practice, however, the amount of light transmission through the display stack is very low (i.e., the transmission might be less than 20% in the visible spectrum), which severely limits the sensing performance under the display.

It is within this context that the embodiments herein arise.

SUMMARY

An electronic device may include a display and an optical sensor formed underneath the display. A pixel removal region on the display may at least partially overlap with the sensor. The pixel removal region may include a plurality of non-pixel regions each of which is devoid of thin-film transistors. The plurality of non-pixel regions is configured to increase the transmittance of light through the display to the sensor.

In addition to removing thin-film transistors in the pixel removal region, additional layers in the display stack-up may be removed. In particular, a cathode layer of the light-emitting diodes in the display may be patterned to have an opening in the pixel removal region. A polyimide layer may be patterned to have an opening in the pixel removal region. A substrate (e.g., formed from PET or PEN) may be patterned to have an opening in the pixel removal region. A polarizer may be bleached in the pixel removal region for additional transmittance gains.

The cathode layer may be removed using laser ablation with a spot laser or blanket illumination. The cathode layer may be removed after one or more additional encapsulation layers are formed in the pixel removal region. The encapsulation layers may also be removed during the cathode etching. An additional encapsulation layer may be formed after etching to ensure the organic layers of the display pixels are sufficiently sealed.

In some cases, the cathode may be removed in regions between pixels in the display (without disrupting the greater pixel array pattern). Isolated cathode openings may be formed between adjacent pixels. Alternatively, a grid of cathode openings may be formed that results in isolated cathode islands over each pixel. A supplemental conductive layer may be used to electrically connect the remaining cathode portions.

DETAILED DESCRIPTION

Figure 1:
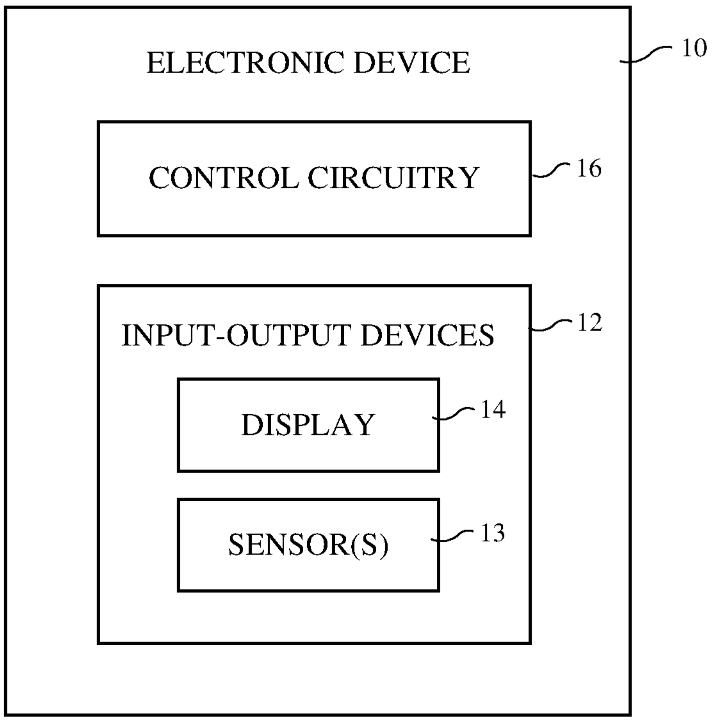
FIG. 1 is a schematic diagram of an illustrative electronic device having a display and one or more sensors in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display or may be a display based on other types of display technology (e.g., liquid crystal displays). Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
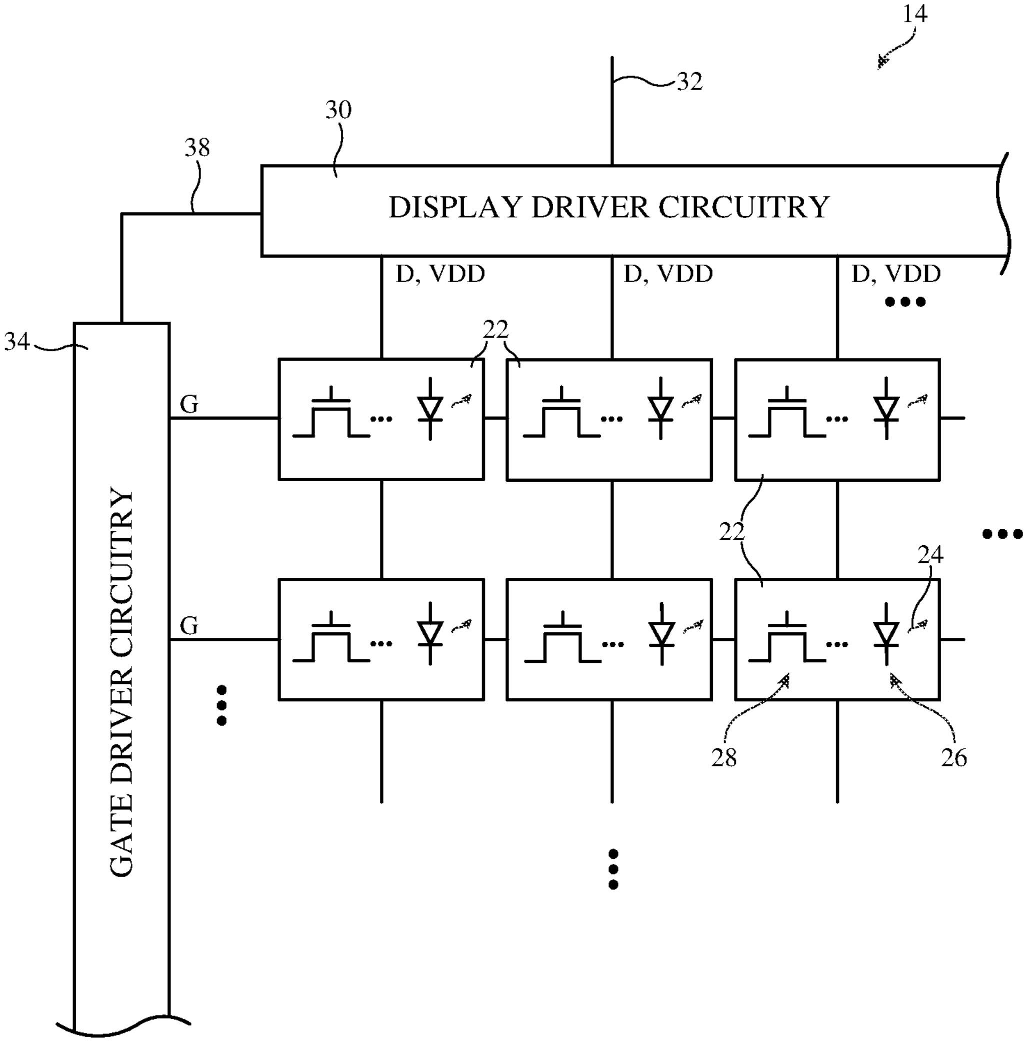
FIG. 2 is a schematic diagram of an illustrative display with light-emitting elements in accordance with an embodiment.

A top view of a portion of display 14 is shown in FIG. 2. As shown in FIG. 2, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 3:
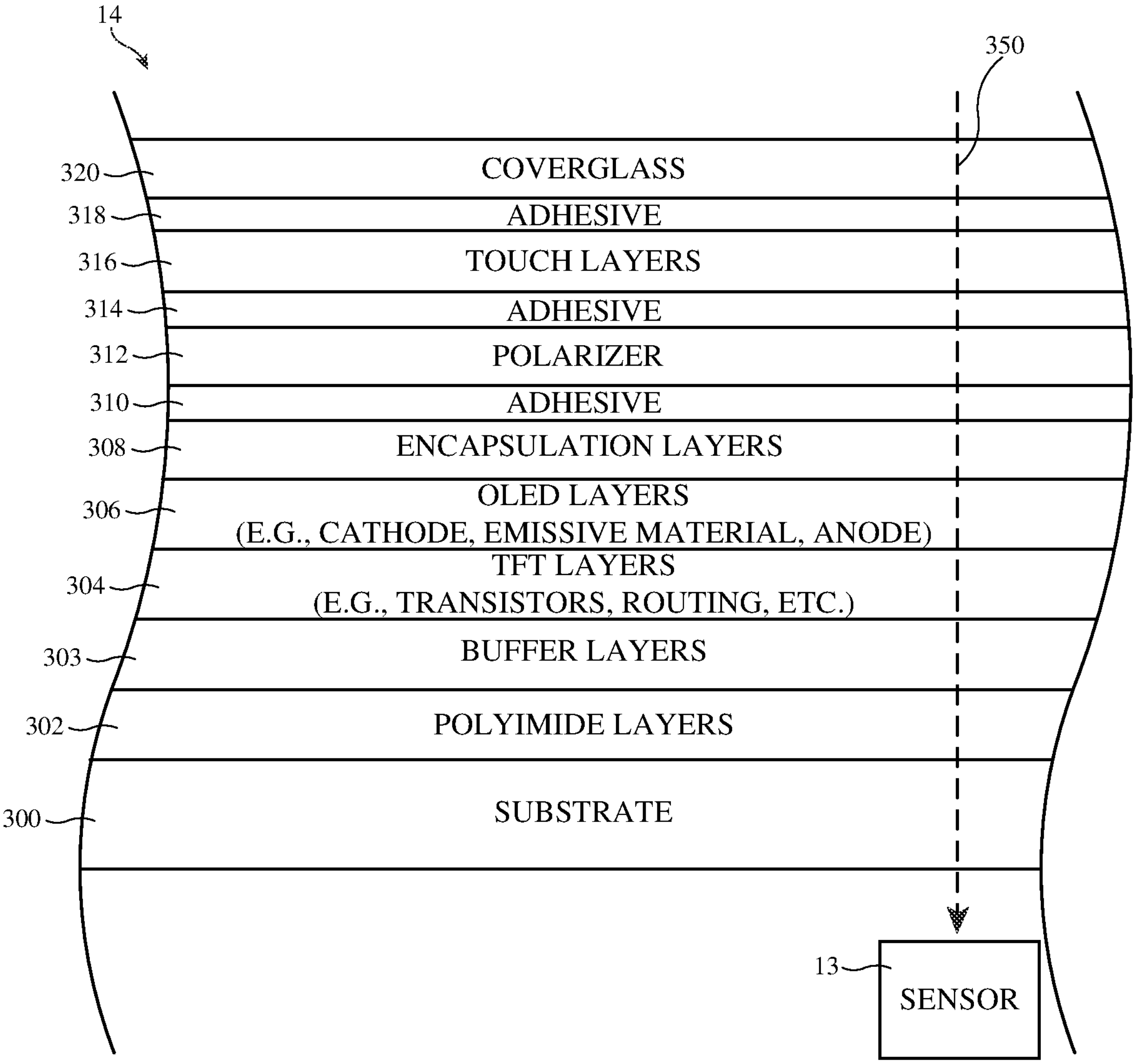
FIG. 3 is a cross-sectional side view of an illustrative display stack that at least partially covers a sensor in accordance with an embodiment.

Device 10 may include a sensor 13 mounted behind display 14. FIG. 3 is a cross-sectional side view of an illustrative display stack of display 14 that at least partially covers a sensor in accordance with an embodiment. As shown in FIG. 3, the display stack may include a substrate such as substrate 300. Substrate 300 may be formed from glass, metal, plastic, ceramic, sapphire, or other suitable substrate materials. In some arrangements, substrate 300 may be an organic substrate formed from polyethylene terephthalate (PET) or polyethylene naphthalate (PEN) (as examples). One or more polyimide (PI) layers 302 may be formed over substrate 300. The polyimide layers may sometimes be referred to as an organic substrate (e.g., substrate 300 is a first substrate layer and substrate 302 is a second substrate layer). The surface of substrate 302 may optionally be covered with one or more buffer layers 303 (e.g., inorganic buffer layers such as layers of silicon oxide, silicon nitride, amorphous silicon, etc.).

Thin-film transistor (TFT) layers 304 may be formed over inorganic buffer layers 303 and organic substrates 302 and 300. The TFT layers 304 may include thin-film transistor circuitry such as thin-film transistors, thin-film capacitors, associated routing circuitry, and other thin-film structures formed within multiple metal routing layers and dielectric layers. Organic light-emitting diode (OLED) layers 306 may be formed over the TFT layers 304. The OLED layers 306 may include a diode cathode layer, a diode anode layer, and emissive material interposed between the cathode and anode layers. The TFT circuitry in layer 304 may be used to control an array of display pixels formed by the OLED layers 306.

Circuitry formed in the TFT layers 304 and the OLED layers 306 may be protected by encapsulation layers 308. As an example, encapsulation layers 308 may include a first inorganic encapsulation layer, an organic encapsulation layer formed on the first inorganic encapsulation layer, and a second inorganic encapsulation layer formed on the organic encapsulation layer. Encapsulation layers 308 formed in this way can help prevent moisture and other potential contaminants from damaging the conductive circuitry that is covered by layers 308.

One or more polarizer films 312 may be formed over the encapsulation layers 308 using adhesive 310. Adhesive 310 may be implemented using optically clear adhesive (OCA) material that offer high light transmittance. One or more touch layers 316 that implement the touch sensor functions of touch-screen display 14 may be formed over polarizer films 312 using adhesive 314 (e.g., OCA material). For example, touch layers 316 may include horizontal touch sensor electrodes and vertical touch sensor electrodes collectively forming an array of capacitive touch sensor electrodes. Lastly, the display stack may be topped off with a coverglass layer 320 that is formed over the touch layers 316 using additional adhesive 318 (e.g., OCA material). Cover glass 320 may serve as an outer protective layer for display 14.

Still referring to FIG. 3, sensor 13 may be formed under the display stack within the electronic device 10. As described above in connection with FIG. 1, sensor 13 may be an optical sensor such as a camera, proximity sensor, ambient light sensor, fingerprint sensor, or other light-based sensor. In such scenarios, the performance of sensor 13 depends on the transmission of light traversing through the display stack, as indicated by arrow 350. A typical display stack, however, has fairly limited transmission properties. For instance, more than 80% of light in the visible spectrum might be lost when traveling through the display stack, which makes sensing under display 14 challenging.

Each of the multitude of layers in the display stack contributes to the degraded light transmission to sensor 13. In particular, the dense thin-film transistors and associated routing structures in TFT layers 304 of the display stack contribute substantially to the low transmission. In accordance with an embodiment, at least some of the display pixels may be selectively removed in regions of the display stack located directly over sensor(s) 13. Regions of display 14 that at least partially cover or overlap with sensor(s) 13 in which at least a portion of the display pixels have been removed are sometimes referred to as pixel removal regions. Removing display pixels (e.g., removing transistors and/or capacitors associated with one or more sub-pixels) in the pixel free regions can drastically help increase transmission and improve the performance of the under-display sensor 13. In addition to removing display pixels, portions of additional layers such as polyimide layers 302 and/or substrate 300 may be removed for additional transmission improvement. Polarizer 312 may also be bleached for additional transmission improvement.

Figure 4:
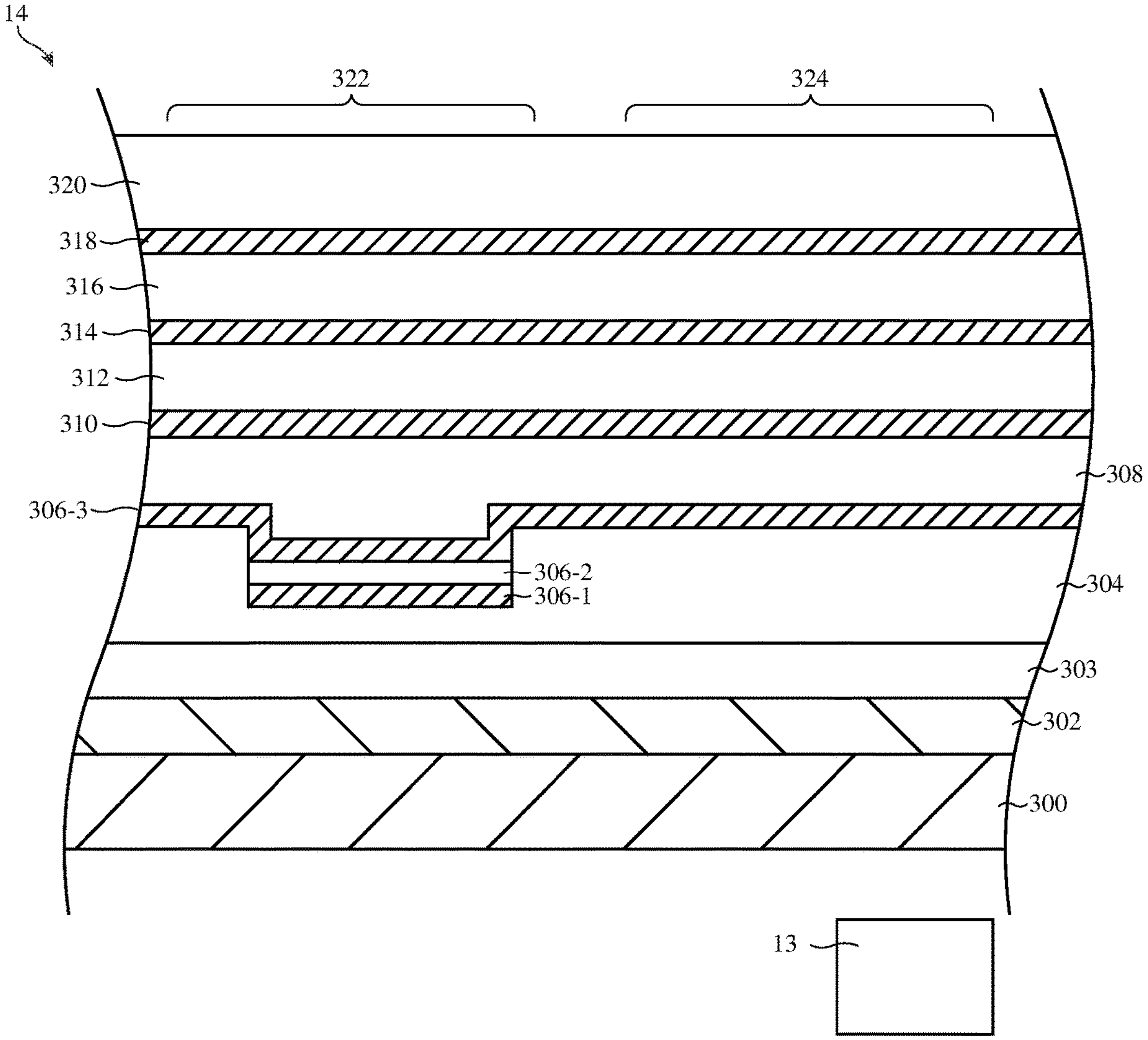
FIG. 4 is a cross-sectional side view of an illustrative display stack with a pixel removal region that at least partially covers a sensor in accordance with an embodiment.

FIG. 4 is a cross-sectional side view of an illustrative display showing how pixels may be removed in a pixel removal region to increase transmission through the display. As shown in FIG. 4, display 14 may include a pixel region 322 and a pixel removal region 324. In the pixel region 322, the display may include a pixel formed from emissive material 306-2 that is interposed between an anode 306-1 and a cathode 306-3. Signals may be selectively applied to anode 306-1 to cause emissive material 306-2 to emit light for the pixel. Circuitry in thin-film transistor layer 304 may be used to control the signals applied to anode 306-1.

In pixel removal region 324, anode 306-1 and emissive material 306-2 may be omitted. Without the pixel removal region, an additional pixel may be formed in area 324 adjacent to the pixel in area 322. However, to increase the transmittance of light to sensor 13 under the display, the pixels in area 324 are removed. The absence of emissive material 306-2 and anode 306-1 may increase the transmittance through the display stack. Additional circuitry within thin-film transistor layer 304 may also be omitted in pixel removal area to increase transmittance.

Figure 5:
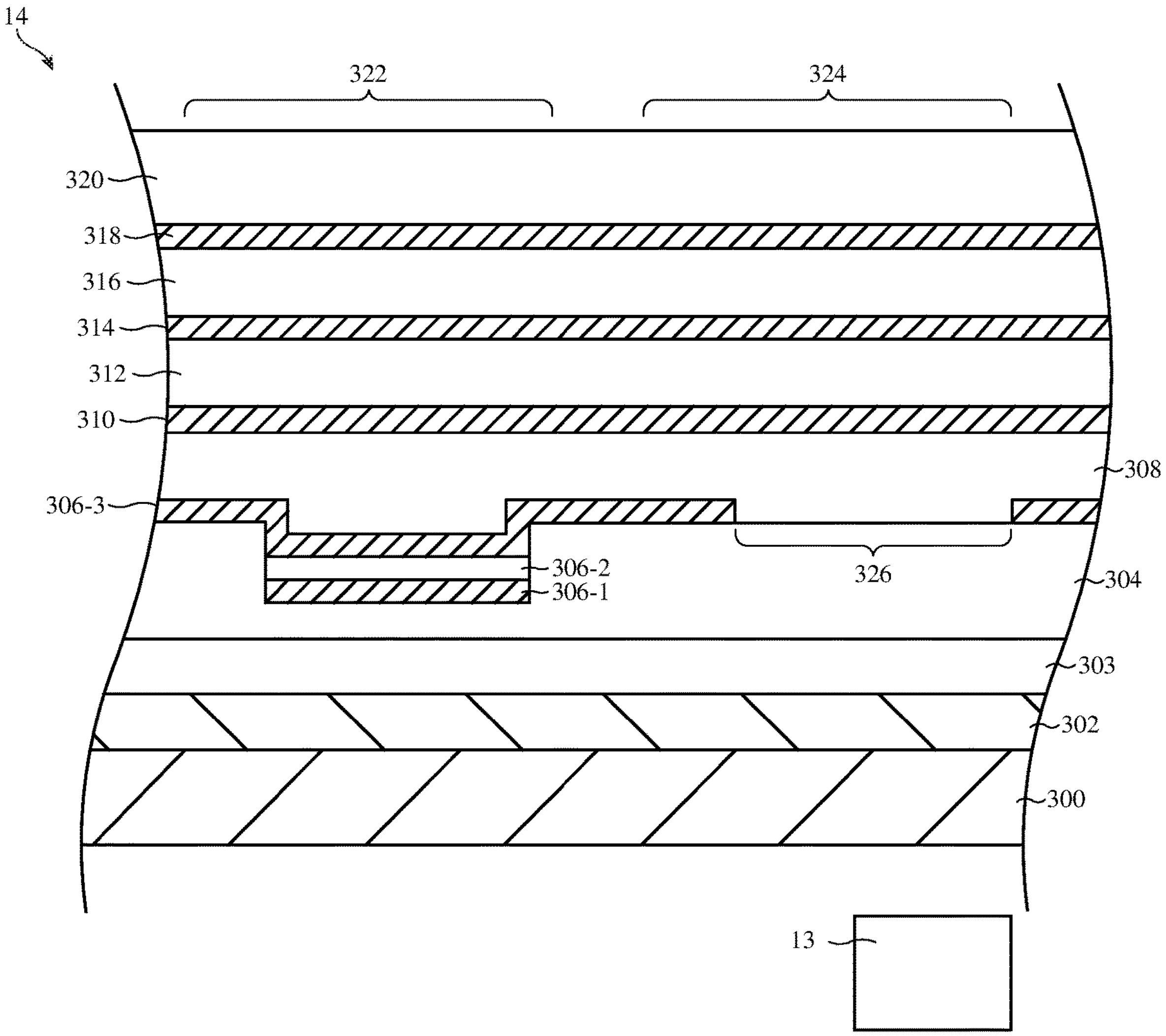
FIG. 5 is a cross-sectional side view of an illustrative display stack with a pixel removal region that includes an opening in a cathode layer in accordance with an embodiment.

Additional transmission improvements through the display stack may be obtained by selectively removing additional components from the display stack in pixel removal area 324. FIG. 5 is a cross-sectional side view of an illustrative display with the cathode removed in pixel removal area 324. As shown in FIG. 5, a portion of cathode 306-3 may be removed in pixel removal region 324. This results in an opening 326 in the cathode 306-3. Said another way, the cathode 306-3 may have conductive material that defines an opening 326 in the pixel removal region. Removing the cathode in this way allows for more light to pass through the display stack to sensor 13. Cathode 306-3 may be formed from any desired conductive material. The cathode may be removed via etching (e.g., laser etching or plasma etching). Alternatively, the cathode may be patterned to have an opening in pixel removal region 324 during the original cathode deposition and formation steps.

Figure 6:
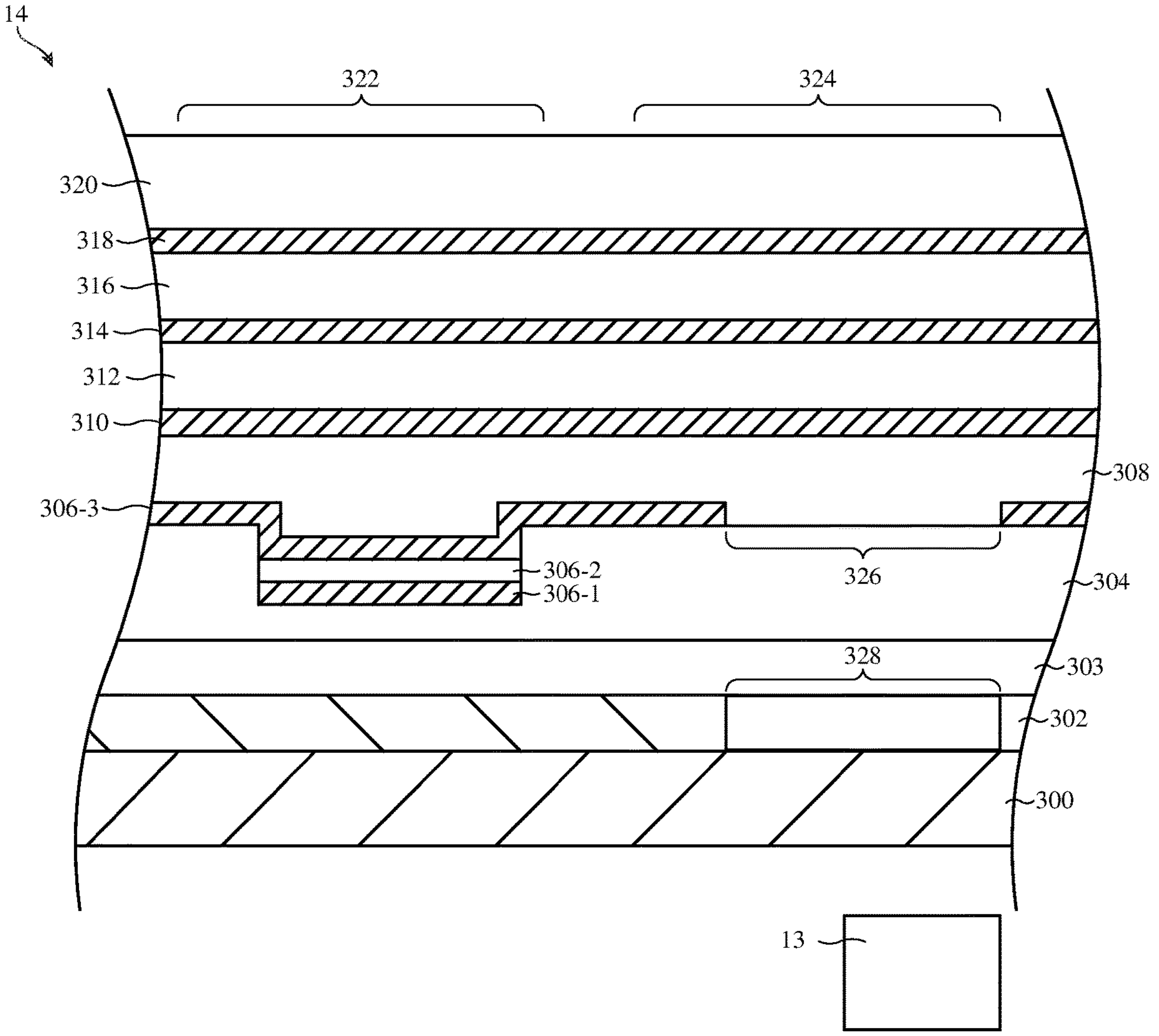
FIG. 6 is a cross-sectional side view of an illustrative display stack with a pixel removal region that includes an opening in a polyimide layer in accordance with an embodiment.

FIG. 6 is a cross-sectional side view of an illustrative display with a portion of the polyimide layers removed in pixel removal region 324. As shown, polyimide layers 302 may be removed in pixel removal region 324 in addition to cathode layer 306-3. The removal of the polyimide layers 302 results in an opening 328 in the pixel removal region. Said another way, the polyimide layer may have polyimide material that defines an opening 328 in the pixel removal region. The polyimide layers may be removed via etching (e.g., laser etching or plasma etching). Alternatively, the polyimide layers may be patterned to have an opening in pixel removal region 324 during the original polyimide formation steps. Removing the polyimide layer 302 in pixel removal region 324 may result in additional transmittance of light to sensor 13 in pixel removal region 324.

Figure 7:
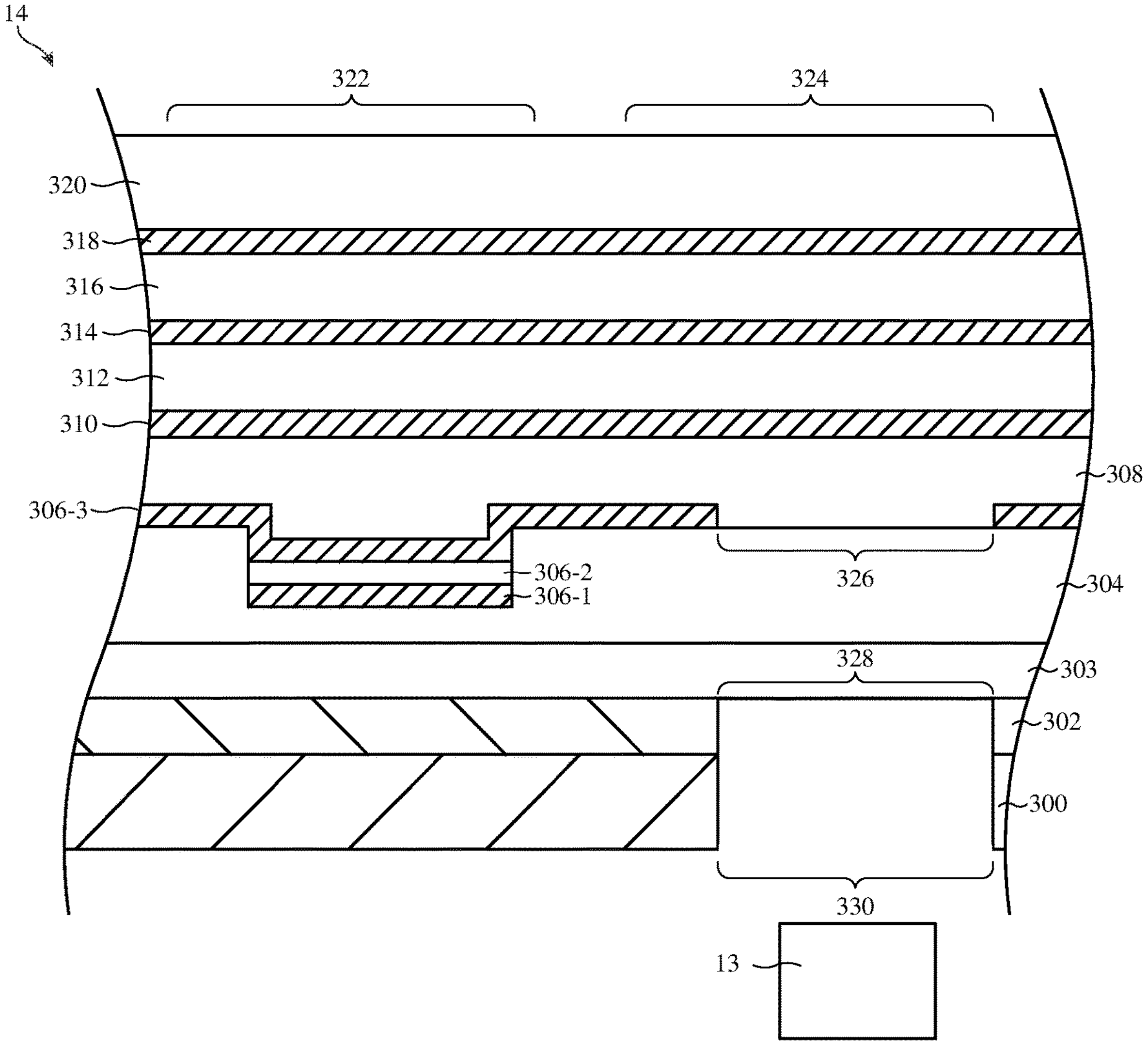
FIG. 7 is a cross-sectional side view of an illustrative display stack with a pixel removal region that includes an opening in a substrate layer in accordance with an embodiment.

FIG. 7 is a cross-sectional side view of an illustrative display with a portion of the substrate removed in pixel removal region 324. As shown, substrate 300 may be removed in pixel removal region 324 in addition to cathode layer 306-3 and polyimide layer 302. The removal of the substrate 300 results in an opening 330 in the pixel removal region. Said another way, the substrate 300 may have material (e.g., PET, PEN, etc.) that defines an opening 330 in the pixel removal region. The substrate may be removed via etching (e.g., with a laser). Alternatively, the substrate may be patterned to have an opening in pixel removal region 324 during the original substrate formation steps. Removing the substrate 300 in pixel removal region 324 may result in additional transmittance of light to sensor 13 in pixel removal region 324. The polyimide opening 328 and substrate opening 330 may be considered to form a single unitary opening. When removing portions of polyimide layer 302 and/or substrate 300, inorganic buffer layers 303 may serve as an etch stop for the etching step. Openings 328 and 330 may be filled with air or another desired transparent filler.

Figure 8:
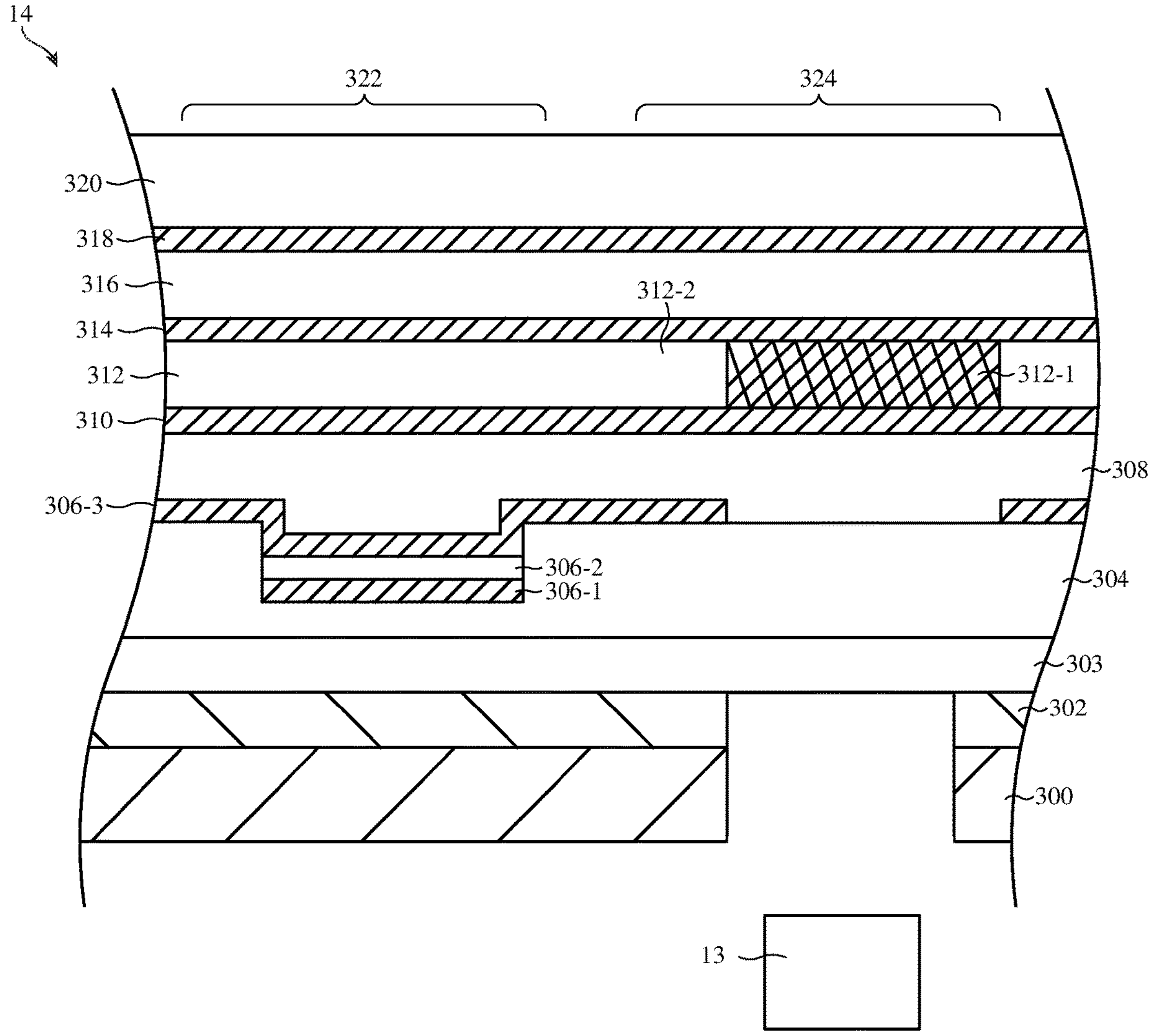
FIG. 8 is a cross-sectional side view of an illustrative display stack with a polarizer having a bleached portion in a pixel removal region in accordance with an embodiment.

In addition to having openings in cathode 306-3, polyimide layers 302, and/or substrate 300, the polarizer in the display may be bleached for additional transmittance in the pixel removal region. FIG. 8 is a cross-sectional side view of an illustrative display with a bleached polarizer in pixel removal region 324. As shown in FIG. 8, polarizer 312 includes a bleached portion 312-1 and an unbleached portion 312-2. In the unbleached portion 312-2, the polarizer may have a transmission (e.g., of visible light) that is about 50%. However, the unbleached polarizer may serve as a linear polarizer that polarizes light emitted from the pixels in pixel region 322. In contrast, the bleached polarizer portion 312-1 may have a light transmission of 80% or more, 90% or more, 95% or more, 99% or more, etc. The bleached polarizer portion 312-1 therefore allows more light to pass through to sensor 13 under the display.

Bleached polarizer portion 312-1 may be formed by exposing polarizer 312 to ultraviolet light, to bleaching chemicals (e.g., potassium hydroxide), or using other desired polarizer bleaching techniques. Bleaching may be performed, for example, after polarizer lamination. If desired, the portion of polarizer 312 in portion 312-1 may be removed (e.g., using laser ablation, etc.). These arrangements may be used to ensure that region 312-1 is transparent and allows light to pass through to sensor 13.

In FIG. 8, polarizer 312 is depicted as having a fully bleached portion 312-1 and a fully unbleached portion 312-2. However, the polarizer may optionally have a transmittance gradient between the fully bleached portion and the fully unbleached portion. This may be achieved by partially bleaching the polarizer between the fully bleached portion and the fully unbleached portion.

Figure 9:
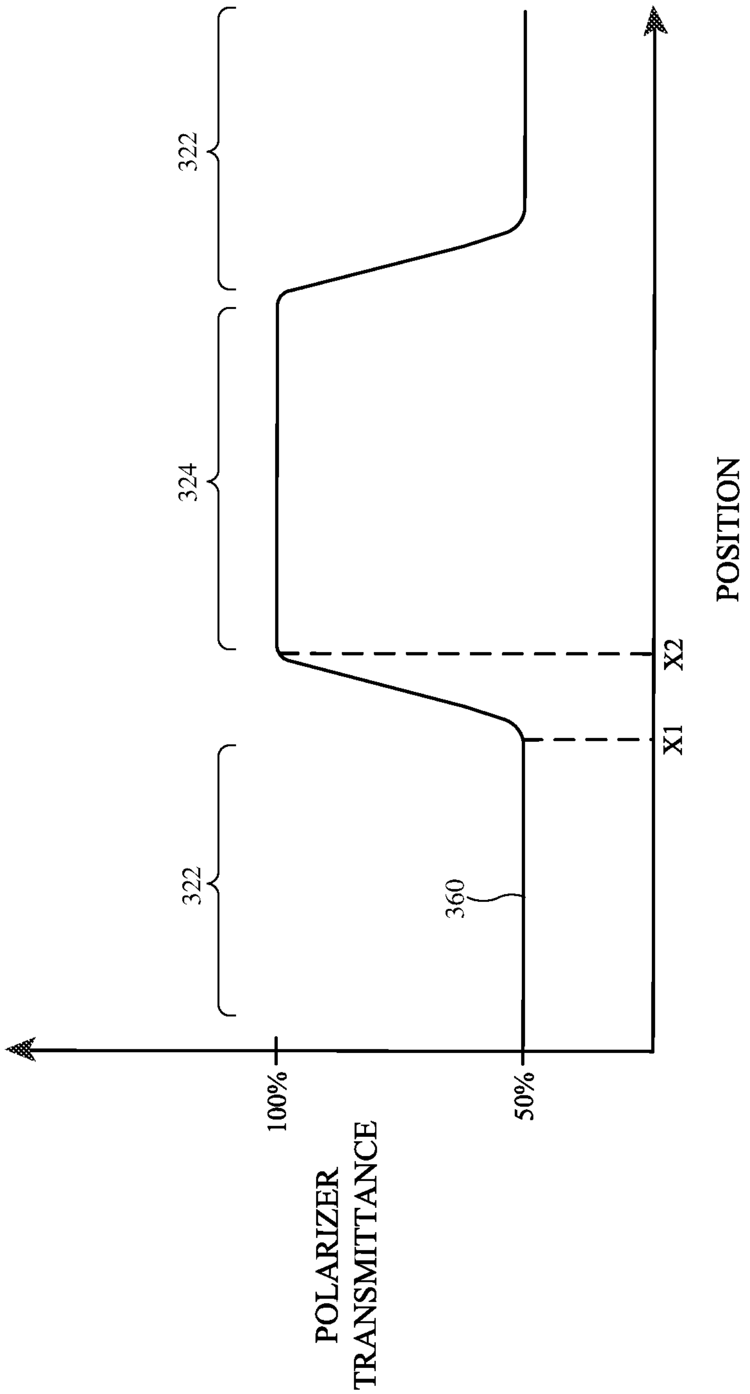
FIG. 9 is a graph showing an illustrative profile for polarizer transmittance relative to position in accordance with an embodiment.

FIG. 9 is a graph of an illustrative transmittance profile for polarizer 312. As shown, the polarizer may have a transmittance profile 360 that varies based on the position within the profile. In pixel regions 322, the polarizer may not be bleached (e.g., fully unbleached). Accordingly, the transmittance of the polarizer in these regions may be approximately 50%, as shown in FIG. 9. In pixel removal regions 324, the polarizer may be bleached (e.g., fully bleached). In other words, the polarizer may have a local maximum of transmittance in the pixel removal region 324. The local maximum may be approximately 100% (as in FIG. 9), more than 99%, more than 95%, more than 90%, more than 80%, between 80% and 100% (inclusive), etc.

Instead of an immediate transition between the bleached and unbleached portions of the polarizer, the polarizer may have a transmittance gradient between the fully bleached and fully unbleached portions. As shown in FIG. 9, the transmittance may gradually change between positions $x_1$ and $x_2$. The transmittance may gradually change linearly, exponentially, according to a step function, or according to any other desired profile. The transmittance has one or more intermediate transmittances between the maximum transmittance (in pixel removal region 324) and the minimum transmittance (in pixel region 322). The transmittance gradient may be achieved by partially bleaching the polarizer according to the desired gradient between the fully bleached and partially bleached portions. The transmittance gradient may help mitigate visible artifacts associated with the pixel removal region.

Figure 10:
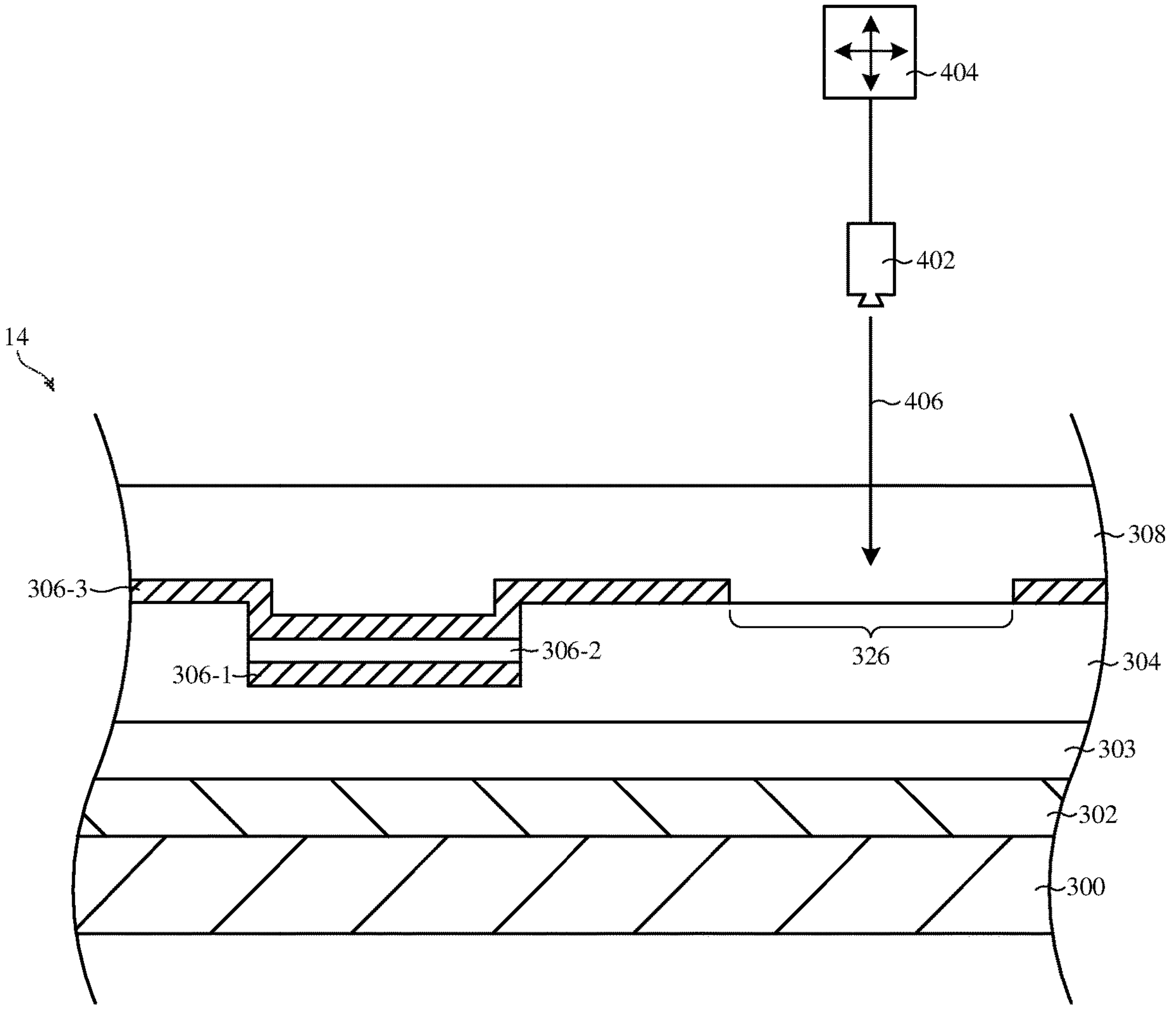
FIG. 10 is a cross-sectional side view of a display showing an illustrative method of removing portions of a cathode layer using a spot laser in accordance with an embodiment.

In some cases, cathode 306-3 may be formed in both pixel region 322 and pixel removal region 324 during an initial deposition step. The cathode may then be removed as desired from the pixel removal region 324. One possible method for removing the cathode is laser etching (e.g., laser ablation). FIG. 10 is a cross-sectional side view of an illustrative display showing how the cathode of the display may be selectively removed using a spot laser.

As shown in FIG. 10, the cathode may optionally be removed before all of the overlying layers cover the cathode. In one example, portions of the cathode may be laser ablated immediately after deposition of the cathode. In another example, shown in FIG. 10, encapsulation 308 may be formed over cathode 306-3 and then portions of the cathode may be removed using laser ablation.

Light source 402 (e.g., a laser) may be controlled by computer-controlled positioner 404. The computer-controlled positioner 404 may move the laser 402 to ablate cathode 306-3 in desired areas. Laser 402 may emit a single beam 406 that is used to ablate (etch) the cathode. The laser may heat the cathode so that the cathode evaporates, in one illustrative ablation technique. Because laser 402 emits a single beam that precisely ablates a specific desired portion of cathode 306-3 (e.g., a single spot), laser 402 may sometimes be referred to as a spot laser.

Figure 11:
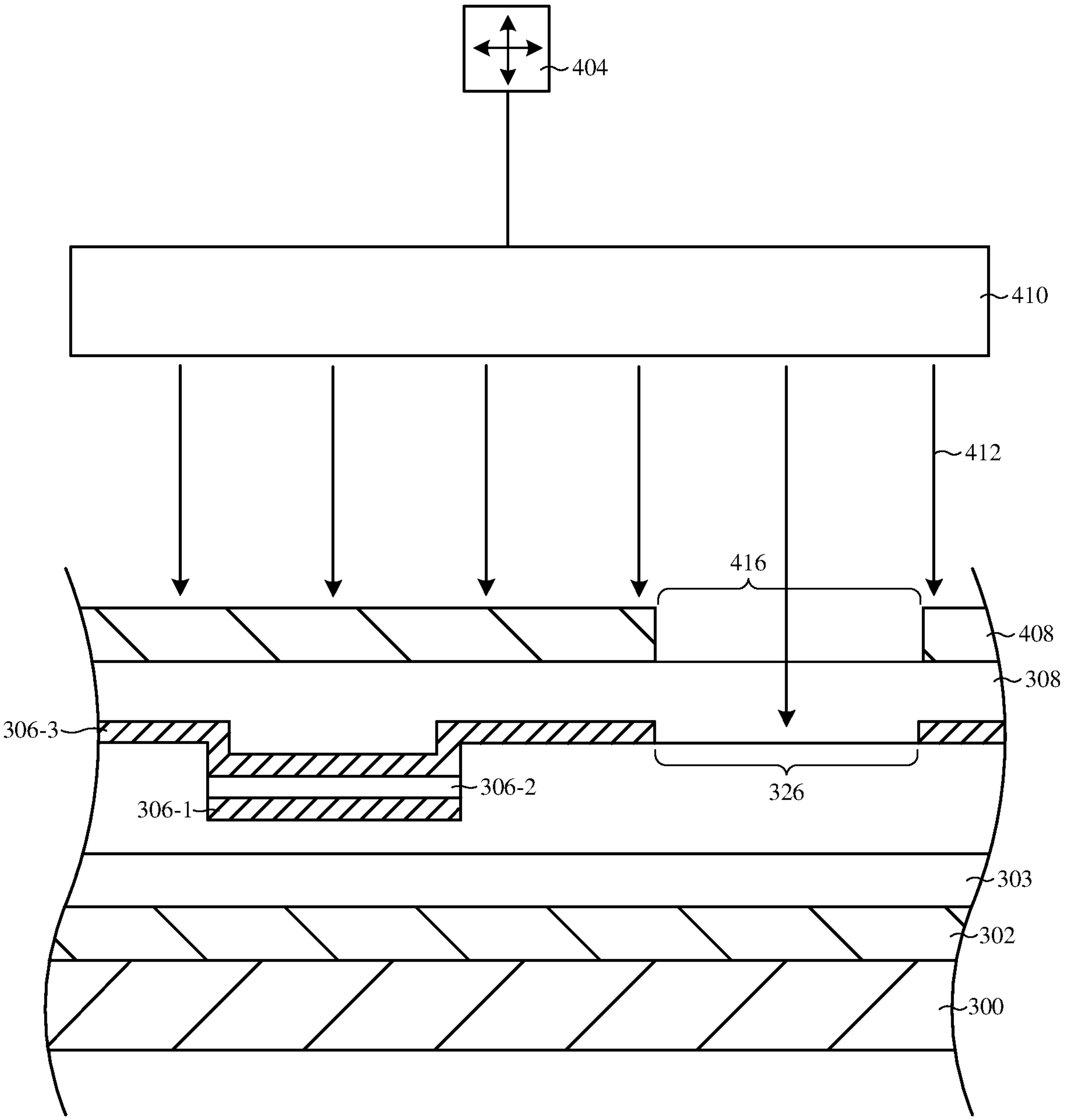
FIG. 11 is a cross-sectional side view of a display showing an illustrative method of removing portions of a cathode layer using blanket illumination in accordance with an embodiment.

FIG. 11 is a cross-sectional side view of an illustrative display showing how the cathode of the display may be removed using blanket illumination. As shown in FIG. 11, a masking layer 408 may be formed over the cathode. The masking layer 408 may cover portions of cathode 306-3 that are intended to remain present after etching (e.g., the portions of the cathode in pixel region 322). Light source 410 (e.g., one or more lasers) may emit blanket illumination 412 across a wider area than spot laser 402. However, masking layer 408 has an opening 416 that overlaps the desired cathode opening 326. Masking layer 408 may be opaque to light 412 from light source 410. Therefore, masking layer 408 blocks light 412 in areas where the cathode is not removed such as pixel region 322. However, masking layer 408 allows light 412 to pass through opening 416 to remove cathode 306-3 and form cathode opening 326.

Masking layer 408 may be formed using photolithography. In other words, masking layer 408 may be a photoresist material that is patterned by exposure to a specific wavelength of light. A mask may control the exposure of light to the photoresist material to produce a mask with openings 416 in desired locations. The photoresist material may then be opaque to the wavelength of blanket illumination 412 to prevent light from reaching unetched portions of cathode 306-3. In FIG. 11, masking layer 408 is formed over encapsulation layer 308. The masking layer may be removed after cathode 306-3 is etched so that the masking layer is not present in the final display stack-up (e.g., masking layer 408 is sacrificial). The masking layer 408 may optionally be formed directly on cathode 306-3 without intervening encapsulation layers 308 if desired.

Light source 410 may be controlled by computer-controlled positioner 404. The computer-controlled positioner 404 may move the light source 410 to ablate cathode 306-3 in desired areas.

Figure 12:
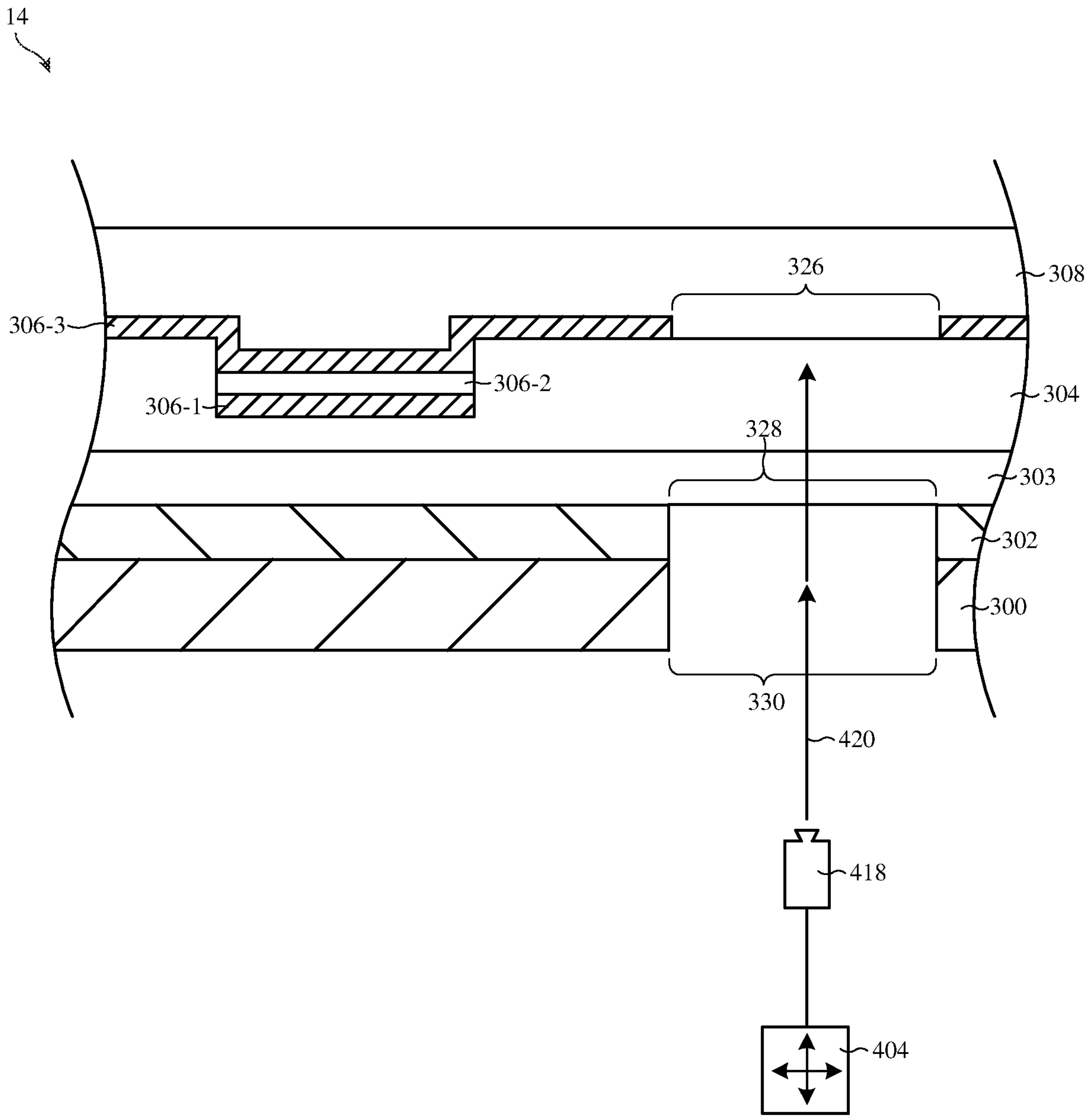
FIG. 12 is a cross-sectional side view of a display showing an illustrative method of simultaneously removing portions of a cathode layer and a substrate in accordance with an embodiment.

As previously shown in connection with FIG. 7, portions of polyimide layer 302 and substrate 300 may also be removed from the display in the pixel removal region in order to increase transmittance. FIG. 12 is a cross-sectional side view of a display showing an illustrative method in which the cathode, polyimide layer, and substrate are ablated by a single laser.

As shown in FIG. 12, the cathode, polyimide layer, and substrate may optionally be removed before all of the overlying layers cover the cathode. In one example, portions of the cathode, polyimide layer, and substrate may be laser ablated immediately after deposition of the cathode. In another example, shown in FIG. 12, encapsulation 308 may be formed over cathode 306-3 and then portions of the cathode, polyimide layer, and substrate may be removed using laser ablation.

Light source 418 (e.g., a laser) may be controlled by computer-controlled positioner 404. The computer-controlled positioner 404 may move the laser 418 to ablate cathode 306-3, polyimide layer 302, and substrate 300 in desired areas. Laser 418 may emit one or more beams 420 that is used to ablate (etch) the cathode, polyimide layer, and substrate. Laser 418 may remove portions of 306-3, polyimide layer 302, and/or substrate 300 simultaneously or in sequence. Laser 418 may have multiple focal points so that multiple layers are etched simultaneously. Laser 418 may also have an adjustable focal point so that the target layer may be dynamically changed based on the focal point. Ultimately, laser 418 may be used to create opening 326 in cathode 306-3, opening 328 in polyimide layer 302, and opening 330 in substrate 300.

Figure 13:
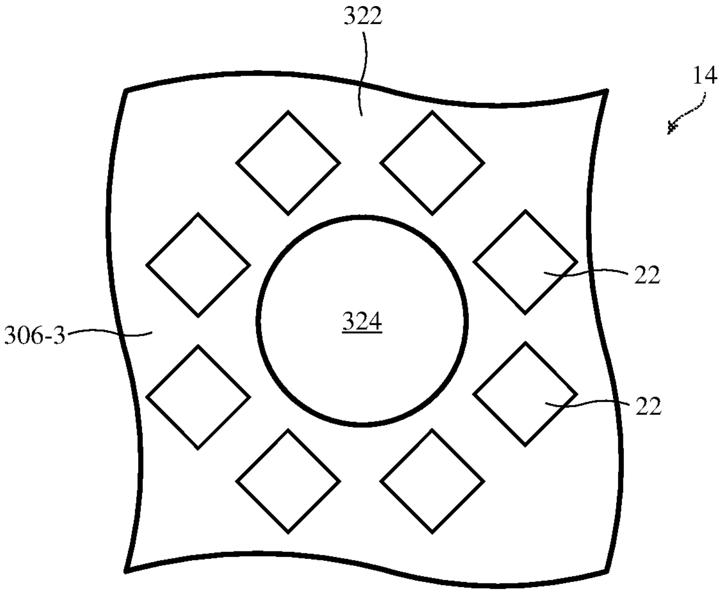
FIG. 13 is a top view of an illustrative display having an opening in a cathode in a pixel removal region in accordance with an embodiment.

In FIG. 4, an example is shown where display 14 has a pixel region 322 and a pixel removal region 324 where pixels are removed from the positions they would occupy if following the pattern from the pixel region 322. FIG. 13 is a top view of a display of this type. As shown in FIG. 13, display 14 has a pixel region 322 with a plurality of pixels 22 arranged in a desired pattern. In pixel removal region 324, pixels that would be present per the pattern of region 322 are removed and no pixels are present. Cathode 306-3 may be patterned to cover pixel regions 322 but not pixel removal regions 324. The pixel removal region 324 may be laterally surrounded by the active area (e.g., active display pixels 22) of the display.

The example of FIG. 13 of having a pixel removal region 322 that is not covered by cathode 306-3 is merely illustrative. In another possible arrangement, shown in FIG. 14, display 14 includes increased transmission areas 424 that are interposed between pixels 22 of the display. In this case, pixels are not entirely removed from the pattern to increase transmittance through the display. However, in areas between the pixels that are not emitting light, portions of the OLED stack-up such as cathode 306-3 may be removed to increase transmittance.

Figure 14:
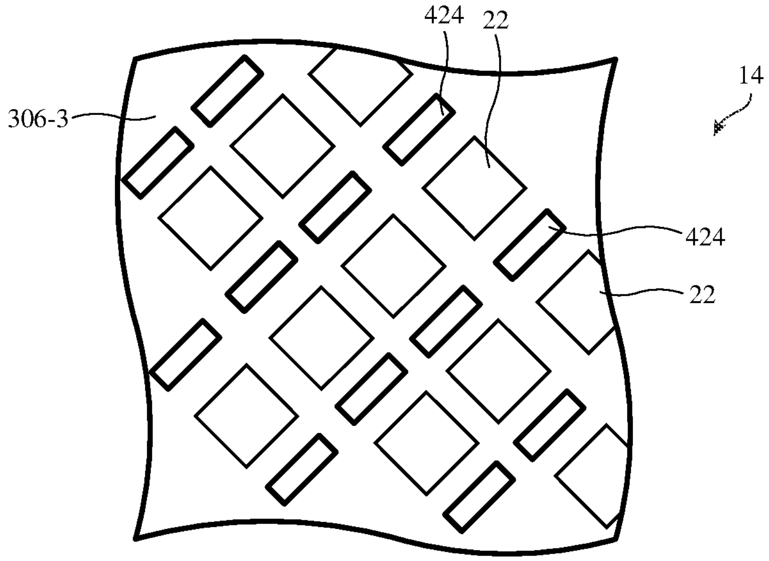
FIG. 14 is a top view of an illustrative display having isolated openings in a cathode between pixels in accordance with an embodiment.

In FIG. 14, increased transmission areas 424 (sometimes referred to as cathode removal areas 424, pixel free regions 424, etc.) are formed as islands. In other words, each cathode removal area 424 is laterally surrounded by portions of cathode 306-3. The cathode 306-3 therefore still forms a continuous grid across the array of pixels. This example is merely illustrative.

Figure 15:
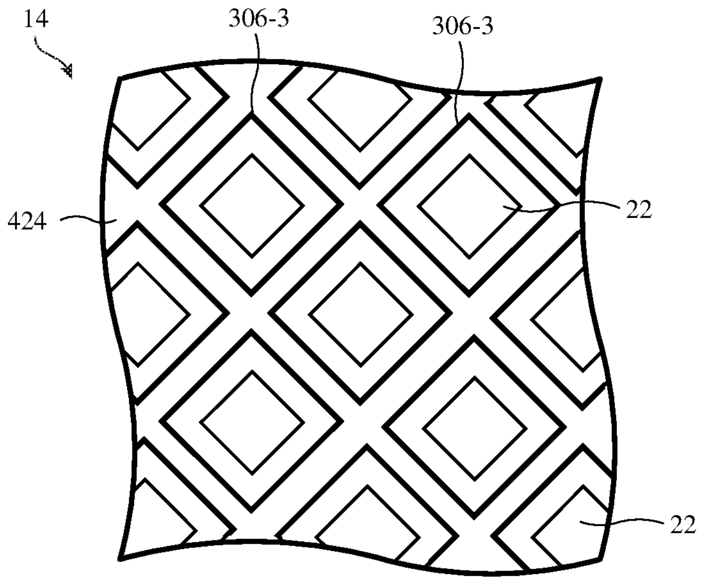
FIG. 15 is a top view of an illustrative display having a grid of openings in a cathode between pixels in accordance with an embodiment.

FIG. 15 is a top view of another possible arrangement for cathode 306-3. As shown in FIG. 15, cathode removal region 424 is formed in a grid between the pixels 22 in the display. In this arrangement, each portion of cathode 306-3 is an island that is laterally surrounded by cathode removal region 424. Each portion of cathode 306-3 may overlap a respective pixel 22 in the display. In an arrangement of the type shown in FIG. 15, it may be desirable for the cathode portions 306-3 to be electrically connected (e.g., so that voltage may be applied to the cathode globally instead of on a per-pixel basis). Therefore, a transparent conductive material (e.g., indium tin oxide) may be used to electrically connect the island portions of cathode 306-3.

In FIGS. 13-15, the cathode may be removed in pixel free regions such as regions 324 and 424. Additional layers may be removed in these areas to further improve transmission (e.g., the polyimide layers may be removed as in FIG. 6, the substrate may be removed as in FIG. 7, the polarizer may be bleached as in FIG. 8, etc.). The cathode in regions 324 and 424 may be removed via laser ablation (e.g., as discussed in connection with FIGS. 10-12) at various stages within the manufacturing of the display.

Figure 16:
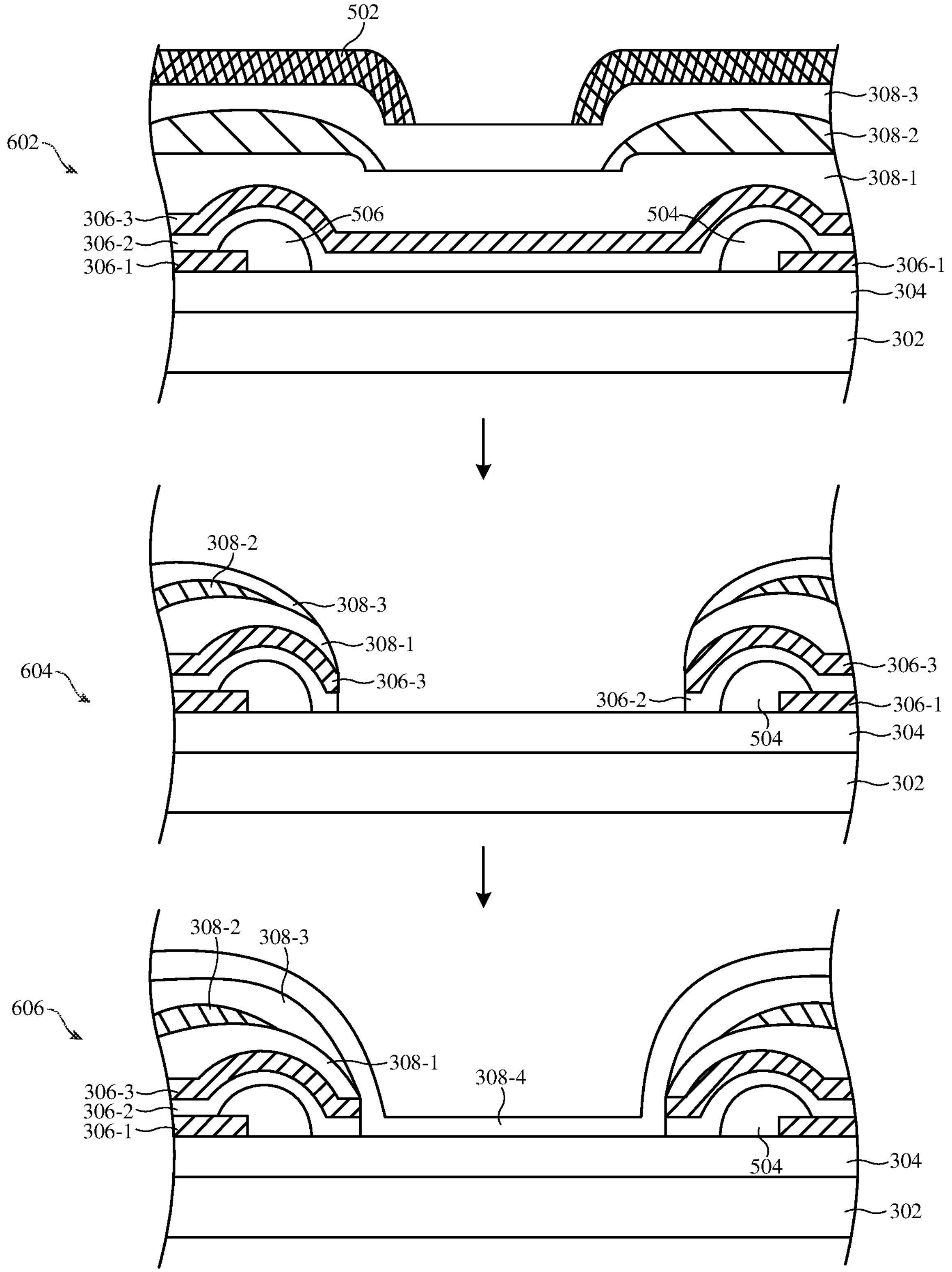
FIG. 16 is a cross-sectional side view showing an illustrative method of forming a display having a cathode opening in a pixel removal region in accordance with an embodiment.

FIG. 16 is a cross-sectional side view of a display showing illustrative processing steps that may be used to remove cathode layer 306-3 in pixel free regions 324 or 424. As shown in FIG. 16, at step 602 the display may include thin-film transistor circuitry 304 on substrate 302. Anodes 306-1 for two different pixels are formed on thin-film transistor circuitry 304. A pixel definition layer 504 is formed over a portion of the anodes 306-1 to define a light-emitting area of the anodes 306-1. An emissive layer 306-2 is formed over anodes 306-1 and the area between anodes 306-1 (e.g., pixel removal region 324). Cathode layer 306-3 is formed over emissive layer 306-2. Therefore, at step 602, cathode layer 306-3 is formed both over anodes 306-1 and in between adjacent anodes 306-1 (e.g., in the pixel removal region).

Multiple encapsulation layers 308 (sometimes referred to as planarization layers 308) may be formed over the OLED layers 306. As shown in FIG. 16, a first encapsulation layer 308-1 may be formed over both the pixel areas and the non-pixel areas (e.g., pixel removal region 324 between pixels). A second encapsulation layer 308-2 may be formed over encapsulation layer 308-1. Encapsulation layer 308-2 may only be formed in the pixel region of the display (hence the absence of encapsulation layer 308-2 between anodes 306-1 in FIG. 16). Encapsulation layer 308-3 may be formed over encapsulation layers 308-1 and 308-2. Encapsulation layer 308-3 may be formed over both the pixel areas and the non-pixel areas (e.g., pixel removal region 324 between pixels). In one example, encapsulation layers 308-1 and 308-3 may be inorganic encapsulation layers, whereas encapsulation layer 308-2 may be an organic encapsulation layer.

A masking layer 502 may also be formed over the pixel regions of the display at step 602. The masking layer 502 may be a sacrificial masking layer that is designed to prevent the cathode from being etched in the pixel regions of the display while allowing the cathode to be etched in the pixel removal regions of the display. The masking layer 502 may therefore have openings over the pixel removal regions of the display.

At step 604, etching may be performed to remove one or more layers in the pixel removal region of the display. As shown in FIG. 16, the etching process may remove emissive layer 306-2, cathode layer 306-3, and planarization layers 308-1 and 308-3. In this way, the cathode is removed in the desired areas (e.g., the pixel removal region 324). Any desired etching process may be used (e.g., laser etching or plasma etching). The etching process may involve removing the sacrificial masking layer 502. In one example, the etching process may remove the masking layer 502 while removing the desired layers between the pixels. In another example, the masking layer may be removed in a separate step after the desired layers between the pixels have been etched.

At step 606, an additional encapsulation layer 308-4 may be deposited over the display. Encapsulation layer 308-4 may be an inorganic passivation layer that is used to again seal the emissive layer 306-2 (which is exposed after the etching in step 604). The inorganic passivation layers 308-1, 308-3, and 308-4 may be formed from the same material or from different materials.

Figure 17:
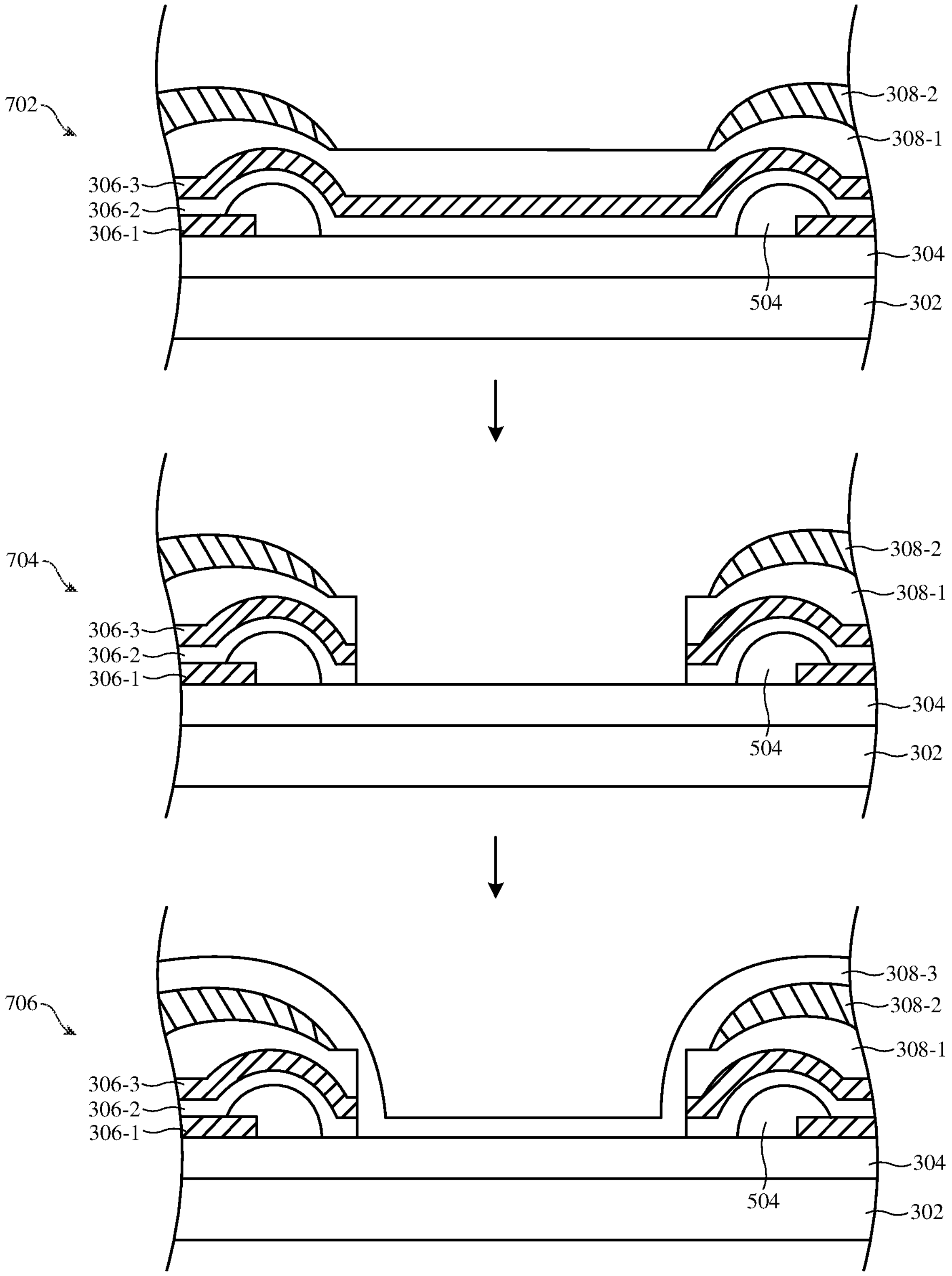
FIG. 17 is a cross-sectional side view showing an illustrative method of forming a display using a masking layer that also serves as an encapsulation layer in accordance with an embodiment.

FIG. 17 is a cross-sectional side view of a display showing illustrative processing steps that may be used to remove cathode layer 306-3 in regions 324 or 424. As shown in FIG. 17, at step 702 the display may include thin-film transistor circuitry 304 on substrate 302. Anodes 306-1 for two different pixels are formed on thin-film transistor circuitry 304. A pixel definition layer 504 is formed over a portion of the anodes 306-1 to define a light-emitting area of the anodes 306-1. An emissive layer 306-2 is formed over anodes 306-1 and the area between anodes 306-1 (e.g., pixel removal region 324). Cathode layer 306-3 is formed over emissive layer 306-2. Therefore, at step 702, cathode layer 306-3 is formed both over anodes 306-1 and in between adjacent anodes 306-1 (e.g., in the pixel removal region).

Multiple encapsulation layers 308 (sometimes referred to as planarization layers 308) may be formed over the OLED layers 306. As shown in FIG. 17, a first encapsulation layer 308-1 may be formed over both the pixel areas and the non-pixel areas (e.g., pixel removal region 324 between pixels). A second encapsulation layer 308-2 may be formed over encapsulation layer 308-1. Encapsulation layer 308-2 may only be formed in the pixel region of the display (hence the absence of encapsulation layer 308-2 between anodes 306-1 in FIG. 17). In one example, encapsulation layer 308-1 may be an inorganic encapsulation layers, whereas encapsulation layer 308-2 may be an organic encapsulation layer.

In FIG. 17, organic encapsulation layer 308-2 serves as a masking layer for the etching step. In other words, the organic material that is formed in step 702 serves as a barrier to protect the pixel regions from etching. At step 704, etching may be performed to remove one or more layers in the pixel removal region of the display. As shown in FIG. 17, the etching process may remove emissive layer 306-2, cathode layer 306-3, and planarization layer 308-1. In this way, the cathode is removed in the desired areas (e.g., the pixel removal region 324). Any desired etching process may be used (e.g., laser etching or plasma etching). The etching process may involve removing some of the material in encapsulation layer 308-2. However, at least some of layer 308-2 remains and serves as an encapsulation layer in the final stack-up of the display.

At step 706, an additional encapsulation layer 308-3 may be deposited over the display. Encapsulation layer 308-3 may be an inorganic passivation layer that is used to again seal the emissive layer 306-2 (which is exposed after the etching in step 704). The inorganic passivation layers 308-1 and 308-3 may be formed from the same material or from different materials.

The illustrative methods of FIGS. 16 and 17 may be used to remove the cathode in pixel removal regions 324 in the display. To remove the cathode in cathode removal regions 424 (e.g., as shown in FIGS. 14 and 15), methods of the type shown in FIGS. 18 and 19 may be used.

Figure 18:
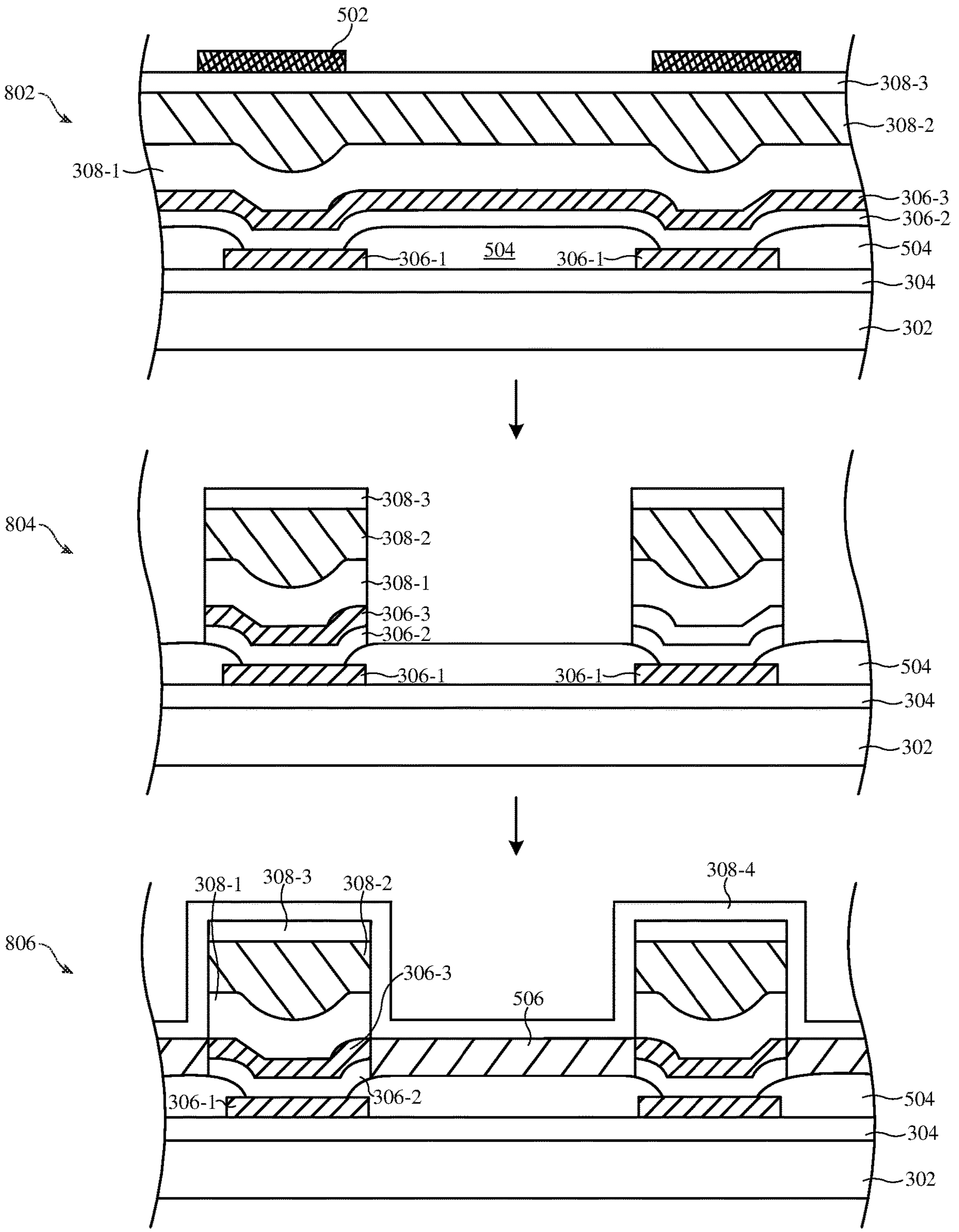
FIG. 18 is a cross-sectional side view showing an illustrative method of forming a display with an etched cathode between pixels in accordance with an embodiment.

FIG. 18 is a cross-sectional side view of a display showing illustrative processing steps that may be used to remove cathode layer 306-3 in pixel free regions such as pixel free regions 424 in FIGS. 14 and 15. As shown in FIG. 18, at step 802 the display may include thin-film transistor circuitry 304 on substrate 302. Anodes 306-1 for two different pixels are formed on thin-film transistor circuitry 304. A pixel definition layer 504 is formed in the area between the pixels and defines a light-emitting area for each pixel. An emissive layer 306-2 is formed over anodes 306-1 and in the area between anodes 306-1 (e.g., cathode removal region 424). Cathode layer 306-3 is formed over emissive layer 306-2. Therefore, at step 802, cathode layer 306-3 is formed both over anodes 306-1 and in between adjacent anodes 306-1 (e.g., in the cathode removal region).

Multiple encapsulation layers 308 (sometimes referred to as planarization layers 308) may be formed over the OLED layers 306. As shown in FIG. 18, first, second, and third encapsulation layers 308-1, 308-2, and 308-3 may be formed over the cathode 306-3. In one example, encapsulation layers 308-1 and 308-3 may be inorganic encapsulation layers, whereas encapsulation layer 308-2 may be an organic encapsulation layer.

A masking layer 502 may also be formed over the pixels of the display at step 802. The masking layer 502 may be a sacrificial masking layer that is designed to prevent the cathode from being etched in the pixel regions of the display while allowing the cathode to be etched in the cathode removal regions of the display (e.g., cathode removal regions 424 in FIG. 14 or 15). The masking layer 502 may therefore have openings over the cathode removal regions of the display.

At step 804, etching may be performed to remove one or more layers in the cathode removal region of the display. As shown in FIG. 18, the etching process may remove emissive layer 306-2, cathode layer 306-3, and planarization layers 308-1, 308-2, and 308-3. In this way, the cathode is removed in the desired areas (e.g., the cathode removal region 424). Any desired etching process may be used (e.g., laser etching or plasma etching). The etching process may involve removing the sacrificial masking layer 502. In one example, the etching process may remove the masking layer 502 while removing the desired layers between the pixels. In another example, the masking layer may be removed in a separate step after the desired layers between the pixels have been etched.

At step 806, an additional conductive layer 506 may optionally be deposited in the cathode removal regions to electrically connect the remaining portions of cathode 306-3. This may be useful in cases such as FIG. 15 where otherwise electrically isolated portions of the cathode would remain after etching. In cases, such as in FIG. 14 where the cathode remains electrically connected across the display, the additional conductive layer 506 may be omitted. The additional conductive layer 506 may be a transparent conductive layer such indium tin oxide (ITO) or any other desired material. In cases where the supplemental conductive layer 506 is included, the cathode may include both original portions 306-3 and supplemental portions 506. These different portions may be formed with different materials, in one possible arrangement. For example, the material of supplemental conductive layer 506 may have a higher transmittance than the material of original cathode portions 306-3.

An additional encapsulation layer 308-4 may also be deposited over the display. Encapsulation layer 308-4 may be an inorganic passivation layer that is used to again seal the emissive layer 306-2 (which is exposed after the etching in step 804). The inorganic passivation layers 308-1, 308-3, and 308-4 may be formed from the same material or from different materials.

Figure 19:
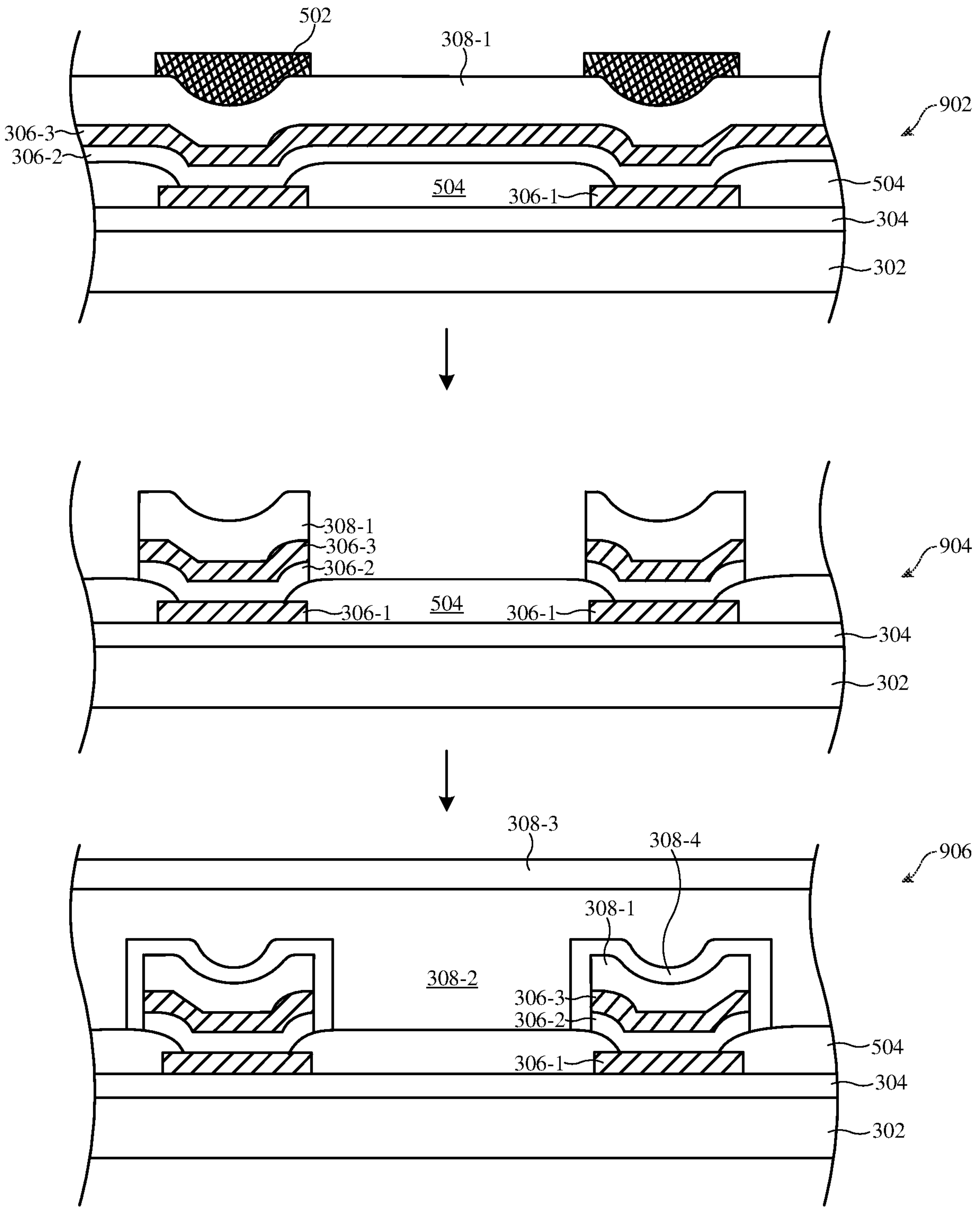
FIG. 19 is a cross-sectional side view showing an illustrative method of forming a display with an etched cathode between pixels and a blanket organic encapsulation layer in accordance with an embodiment.

FIG. 19 is a cross-sectional side view of a display showing illustrative processing steps that may be used to remove cathode layer 306-3 in pixel free regions such as regions 424. As shown in FIG. 19, at step 902 the display may include thin-film transistor circuitry 304 on substrate 302. Anodes 306-1 for two different pixels are formed on thin-film transistor circuitry 304. A pixel definition layer 504 is formed in the area between the pixels and defines a light-emitting area for each pixel. An emissive layer 306-2 is formed over anodes 306-1 and in the area between anodes 306-1 (e.g., cathode removal region 424). Cathode layer 306-3 is formed over emissive layer 306-2. Therefore, at step 902, cathode layer 306-3 is formed both over anodes 306-1 and in between adjacent anodes 306-1 (e.g., in the cathode removal region).

One or more encapsulation layers 308 (sometimes referred to as planarization layers 308) may be formed over the OLED layers 306. As shown in FIG. 19, a first encapsulation layers 308-1 may be formed over the cathode 306-3. In one example, encapsulation layer 308-1 may be an inorganic encapsulation layer.

A masking layer 502 may also be formed over the pixels of the display at step 902. The masking layer 502 may be a sacrificial masking layer that is designed to prevent the cathode from being etched in the pixel regions of the display while allowing the cathode to be etched in the cathode removal regions of the display (e.g., cathode removal regions 424 in FIG. 14 or 15). The masking layer 502 may therefore have openings over the cathode removal regions of the display.

At step 904, etching may be performed to remove one or more layers in the cathode removal region of the display. As shown in FIG. 19, the etching process may remove emissive layer 306-2, cathode layer 306-3, and planarization layer 308-1. In this way, the cathode is removed in the desired areas (e.g., the cathode removal region 424). Any desired etching process may be used (e.g., laser etching or plasma etching). The etching process may involve removing the sacrificial masking layer 502. In one example, the etching process may remove the masking layer 502 while removing the desired layers between the pixels. In another example, the masking layer may be removed in a separate step after the desired layers between the pixels have been etched.

At step 906, an additional encapsulation layer 308-4 may also be deposited over the pixels. Encapsulation layer 308-4 may be an inorganic passivation layer that is used to again seal the emissive layer 306-2 (which is exposed after the etching in step 904). A blanket organic passivation layer 308-2 may then be formed over the display, followed by an inorganic passivation layer 308-3. The inorganic passivation layers 308-1, 308-3, and 308-4 may be formed from the same material or from different materials.

The methods of FIGS. 16-19 may be used to remove the cathode from the display in pixel free regions 324 (e.g., pixel removal regions) and/or pixel free regions 424 (areas between pixels in the pixel array). In the displays formed in any of FIGS. 16-19, additional layers may be removed in addition to the cathode to further improve transmission (e.g., the polyimide layers may be removed as in FIG. 6, the substrate may be removed as in FIG. 7, the polarizer may be bleached as in FIG. 8, etc.).

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

In accordance with an embodiment, an electronic device is provided that includes a display that includes a plurality of pixels, at least one substrate, and a thin-film transistor layer that is formed over the at least one substrate and that is configured to control the plurality of pixels, and a sensor under the display, the display includes a pixel free region that at least partially overlaps with the sensor and the at least one substrate has an opening in the pixel free region that increases the transmittance of light through the display to the sensor.

In accordance with another embodiment, the at least one substrate includes at least one polyimide layer that is formed over an additional substrate.

In accordance with another embodiment, the opening is formed in the at least one polyimide layer in the pixel free region.

In accordance with another embodiment, the opening is formed in the additional substrate in the pixel free region.

In accordance with another embodiment, the additional substrate includes a material selected from the group consisting of polyethylene terephthalate and polyethylene naphthalate.

In accordance with another embodiment, the opening is a first opening that is formed in the at least one polyimide layer in the pixel free region and the display includes a second opening that is formed in the additional substrate in the pixel free region.

In accordance with another embodiment, the display includes a polarizer layer that is formed over the plurality of pixels, the polarizer layer has a bleached portion in the pixel free region and an unbleached portion formed over the plurality of pixels.

In accordance with another embodiment, the polarizer has a first transmittance in the bleached portion, a second transmittance in the unbleached portion, and at least one intermediate transmittance that is greater than the second transmittance and lower than the first transmittance at a position that is between the bleached portion and the unbleached portion.

In accordance with another embodiment, the plurality of pixels includes a plurality of anodes, an emissive layer, and a cathode layer and the display includes a third opening that is formed in the cathode layer in the pixel free region.

In accordance with an embodiment, an electronic device is provided that includes a sensor, a display that overlaps the sensor, the sensor is configured to sense light that passes through the display and the display includes a plurality of light-emitting diodes formed by a plurality of anodes, emissive material that overlaps the plurality of anodes, and a cathode layer that overlaps the emissive material, a first encapsulation layer formed over the cathode layer that has a first opening that overlaps at least a portion of the sensor, the cathode layer has a second opening that overlaps the first opening, and a second encapsulation layer formed over the first encapsulation layer that overlaps the first and second openings.

In accordance with another embodiment, the first encapsulation layer is a first inorganic encapsulation layer and the second encapsulation layer is a second inorganic encapsulation layer.

In accordance with another embodiment, the display includes an organic encapsulation layer that is interposed between the first and second inorganic encapsulation layers.

In accordance with another embodiment, the display includes a third inorganic encapsulation layer that has a third opening that overlaps the first and second openings, the third inorganic encapsulation layer is interposed between the organic encapsulation layer and the second inorganic encapsulation layer.

In accordance with another embodiment, the organic encapsulation layer is in direct contact with the first and second inorganic encapsulation layers.

In accordance with another embodiment, the display includes a third inorganic encapsulation layer, the third inorganic encapsulation layer has respective portions that each overlap a respective portion of the first inorganic encapsulation layer, a respective portion of the cathode layer, a respective portion of the emissive layer, and a respective anode.

In accordance with another embodiment, the display includes a pixel definition layer that is interposed between the plurality of anodes, the organic encapsulation layer overlaps the third inorganic encapsulation layer and the pixel definition layer.

In accordance with another embodiment, the organic encapsulation layer has first and second opposing sides, the first side of the organic encapsulation layer is in direct contact with the third inorganic encapsulation layer and the pixel definition layer, and the second side of the organic encapsulation layer is in direct contact with the second inorganic encapsulation layer.

In accordance with another embodiment, the display includes a thin-film transistor layer, the plurality of light-emitting diodes is formed on the thin-film transistor layer and the second opening overlaps a pixel removal region in which the thin-film transistor layer is devoid of thin-film transistors.

In accordance with another embodiment, the second opening is one of a plurality of cathode openings, each cathode opening is interposed between adjacent light-emitting diodes of the plurality of light-emitting diodes, and each cathode opening is laterally surrounded by the cathode layer.

In accordance with another embodiment, the second opening of is part of a grid of openings in the cathode layer that define respective cathode islands over each light-emitting diode of the plurality of light-emitting diodes.

In accordance with another embodiment, the display includes a supplemental conductive layer that electrically connects the respective cathode islands of the cathode layer.

In accordance with an embodiment, a method of forming a display that includes a thin-film transistor layer and a plurality of light-emitting diodes formed by a plurality of anodes, emissive material that overlaps the plurality of anodes, and a cathode layer that overlaps the emissive material, the method is provided that includes forming a first encapsulation layer over the cathode layer, the first encapsulation layer is a blanket layer, patterning a masking layer over the first encapsulation layer, the masking layer has at least one opening, and etching the cathode layer in a region that is overlapped by the at least one opening, at least a portion of the masking layer remains after etching the cathode layer and serves as a second encapsulation layer for the display.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:

a display that includes a plurality of pixels, at least one substrate, a thin-film transistor layer that is formed over the at least one substrate and that is configured to control the plurality of pixels, and an inorganic buffer layer interposed between the at least one substrate and the thin-film transistor layer, wherein the plurality of light-emitting diodes is formed on the thin-film transistor layer; and a sensor under the display, wherein the display comprises a pixel free region that at least partially overlaps with the sensor, wherein the at least one substrate has an opening in the pixel free region that increases the transmittance of light through the display to the sensor, wherein the thin-film transistor layer comprises a metal routing layer, wherein the thin-film transistor layer covers the opening, and wherein the inorganic buffer layer covers the opening.

2. The electronic device defined in claim 1, wherein the display emits light in a direction, wherein the pixel free region at least partially overlaps with the sensor in the direction, and wherein the thin-film transistor layer overlaps the opening in the direction.

3. The electronic device defined in claim 2, wherein the at least one substrate comprises at least one polyimide layer that is formed over an additional substrate and wherein the opening is formed in the at least one polyimide layer in the pixel free region.

4. The electronic device defined in claim 2, wherein the at least one substrate comprises at least one polyimide layer that is formed over an additional substrate and wherein the opening is formed in the additional substrate in the pixel free region.

5. The electronic device defined in claim 4, wherein the additional substrate comprises a material selected from the group consisting of: polyethylene terephthalate and polyethylene naphthalate.

6. The electronic device defined in claim 2, wherein the at least one substrate comprises at least one polyimide layer that is formed over an additional substrate and wherein the opening is a first opening that is formed in the at least one polyimide layer in the pixel free region and wherein the display comprises a second opening that is formed in the additional substrate in the pixel free region.

7. The electronic device defined in claim 6, wherein the display further comprises:

a polarizer layer that is formed over the plurality of pixels, wherein the polarizer layer has a bleached portion in the pixel free region and an unbleached portion formed over the plurality of pixels, wherein the polarizer layer has a partially bleached portion in between the bleached portion and the unbleached portion, and wherein the polarizer layer has a first transmittance in the bleached portion, a second transmittance in the unbleached portion, and at least one intermediate transmittance that is greater than the second transmittance and lower than the first transmittance at a position in the partially bleached portion.

8. The electronic device defined in claim 1, wherein the plurality of pixels comprises a plurality of anodes, an emissive layer, and a cathode layer and wherein the display further comprises a third opening that is formed in the cathode layer in the pixel free region.

9. An electronic device, comprising:

a sensor;

a display that overlaps the sensor and emits first light in a direction, wherein the sensor is configured to sense second light that passes through the display and wherein the display comprises:

a plurality of light-emitting diodes formed by a plurality of anodes, emissive material that overlaps the plurality of anodes, and a cathode layer that overlaps the emissive material;

a first encapsulation layer formed over the cathode layer, wherein the first encapsulation layer has a first opening that overlaps at least a portion of the sensor in the direction and wherein the cathode layer has a second opening that overlaps the first opening in the direction;

a second encapsulation layer formed over the first encapsulation layer and overlapping the first and second openings in the direction; and thin-film transistor layers, wherein the plurality of light-emitting diodes is formed over the thin-film transistor layers and wherein the thin-film transistor layers overlap the first or second opening in the direction.

10. The electronic device defined in claim 9, wherein the thin-film transistor layers comprise metal routing layers and dielectric layers.

11. The electronic device defined in claim 9, wherein the first encapsulation layer is a first inorganic encapsulation layer and the second encapsulation layer is a second inorganic encapsulation layer and wherein the display further comprises:

an organic encapsulation layer that is interposed between the first and second inorganic encapsulation layers.

12. The electronic device defined in claim 11, wherein the display further comprises:

a third inorganic encapsulation layer that has a third opening that overlaps the first and second openings, wherein the third inorganic encapsulation layer is interposed between the organic encapsulation layer and the second inorganic encapsulation layer.

13. The electronic device defined in claim 11, wherein the organic encapsulation layer is in direct contact with the first and second inorganic encapsulation layers.

14. The electronic device defined in claim 11, wherein the display further comprises:

a third inorganic encapsulation layer, wherein the third inorganic encapsulation layer has respective portions that each overlap a respective portion of the first inorganic encapsulation layer, a respective portion of the cathode layer, a respective portion of the emissive layer, and a respective anode.

15. The electronic device defined in claim 14, wherein the display further comprises:

a pixel definition layer that is interposed between the plurality of anodes, wherein the organic encapsulation layer overlaps the third inorganic encapsulation layer and the pixel definition layer.

16. The electronic device defined in claim 15, wherein the organic encapsulation layer has first and second opposing sides, wherein the first side of the organic encapsulation layer is in direct contact with the third inorganic encapsulation layer and the pixel definition layer, and wherein the second side of the organic encapsulation layer is in direct contact with the second inorganic encapsulation layer.

17. The electronic device defined in claim 9, wherein the second opening overlaps a pixel removal region that is devoid of thin-film transistors.

18. The electronic device defined in claim 9, wherein the second opening is one of a plurality of cathode openings, wherein each cathode opening is interposed between adjacent light-emitting diodes of the plurality of light-emitting diodes, and wherein each cathode opening is laterally surrounded by the cathode layer.

19. The electronic device defined in claim 9, wherein the second opening is part of a grid of openings in the cathode layer that define respective cathode islands over each light-emitting diode of the plurality of light-emitting diodes.

20. The electronic device defined in claim 19, wherein the display further comprises:

a supplemental conductive layer that electrically connects the respective cathode islands of the cathode layer.

21. A method of forming a display that includes a thin-film transistor layer and a plurality of light-emitting diodes formed by a plurality of anodes, emissive material that overlaps the plurality of anodes, and a cathode layer that overlaps the emissive material, wherein the plurality of light-emitting diodes is formed on the thin-film transistor layer, the method comprising:

forming a first encapsulation layer over the cathode layer, wherein the first encapsulation layer is a blanket layer;

patterning an opaque masking layer over the first encapsulation layer, wherein the opaque masking layer has at least one opening; and etching the cathode layer in a region that is overlapped by the at least one opening, wherein at least a portion of the opaque masking layer remains after etching the cathode layer and serves as a second encapsulation layer for the display and wherein the thin-film transistor layer covers the at least one opening.

* * * * *